United States Patent
Abe

(10) Patent No.: US 7,830,189 B2
(45) Date of Patent: Nov. 9, 2010

(54) DLL CIRCUIT AND CONTROL METHOD THEREFOR

(75) Inventor: Tsuneo Abe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/552,816

(22) Filed: Sep. 2, 2009

(65) Prior Publication Data

US 2010/0052751 A1 Mar. 4, 2010

(30) Foreign Application Priority Data

Sep. 4, 2008 (JP) ............................. 2008-227324

(51) Int. Cl.
*H03L 7/06* (2006.01)
(52) U.S. Cl. ...................... 327/158; 327/149
(58) Field of Classification Search .......... 327/146–158
See application file for complete search history.

(56) References Cited

U.S. PATENT DOCUMENTS

| | | | | |
|---|---|---|---|---|
| 5,610,954 A * | 3/1997 | Miyashita et al. | ............ | 375/375 |
| 5,883,534 A * | 3/1999 | Kondoh et al. | ............... | 327/156 |
| 5,889,828 A * | 3/1999 | Miyashita et al. | ............ | 375/374 |
| 5,956,378 A * | 9/1999 | Soda | ............ | 375/376 |
| 5,973,525 A * | 10/1999 | Fujii | ............ | 327/158 |
| 6,642,760 B1 * | 11/2003 | Alon et al. | ............ | 327/158 |
| 6,724,228 B2 * | 4/2004 | Kashiwazaki | ............... | 327/158 |
| 7,184,509 B2 * | 2/2007 | Cho et al. | ............ | 375/373 |
| 7,327,176 B2 * | 2/2008 | Takai et al. | ............ | 327/158 |
| 7,348,823 B2 * | 3/2008 | Takai et al. | ............ | 327/291 |
| 7,541,853 B2 * | 6/2009 | Nakadaira | ............ | 327/241 |
| 7,642,826 B2 * | 1/2010 | Takai | ............ | 327/158 |
| 7,724,161 B1 * | 5/2010 | Cyrusian | ............ | 341/53 |
| 7,750,712 B2 * | 7/2010 | Ide et al. | ............ | 327/276 |
| 2003/0052718 A1 | 3/2003 | Takai | | |
| 2005/0024107 A1 * | 2/2005 | Takai et al. | ............ | 327/158 |
| 2007/0194824 A1 | 8/2007 | Kumata | | |
| 2007/0279111 A1 * | 12/2007 | Maeda et al. | ............ | 327/158 |
| 2007/0279112 A1 * | 12/2007 | Maeda et al. | ............ | 327/158 |
| 2007/0279113 A1 * | 12/2007 | Maeda et al. | ............ | 327/158 |
| 2008/0007310 A1 * | 1/2008 | Austin et al. | ............ | 327/152 |
| 2008/0174347 A1 * | 7/2008 | Oshima | ............ | 327/145 |
| 2010/0123499 A1 * | 5/2010 | Takahashi et al. | ............ | 327/158 |
| 2010/0177588 A1 * | 7/2010 | Kaiwa et al. | ............ | 365/233.11 |

FOREIGN PATENT DOCUMENTS

JP 2008-136031 6/2008

* cited by examiner

*Primary Examiner*—Lincoln Donovan
*Assistant Examiner*—Adam D Houston
(74) *Attorney, Agent, or Firm*—Morrison & Foerster LLP

(57) ABSTRACT

A DLL (delay locked loop) circuit includes a first variable delay circuit, a pair of second variable delay circuits and a first synthesis circuit. The first variable delay circuit outputs signals of different delayed time values from each of first and second clock transitions. The pair of second variable delay circuits receive the signals from the first variable delay circuit, and the first synthesis circuit synthesizes output signals of the pair of second variable delay circuits to output the resulting synthesized signal. Each of the pair of second variable delay circuits includes a pair one-shot pulse generating circuits that generate one-shot pulses from the signals from the first variable delay circuit, a pair latch circuits, and a second synthesis circuit. The second synthesis circuit receives the set outputs of the latch circuits to output a signal which is a synthesis at a preset synthesis ratio.

20 Claims, 11 Drawing Sheets

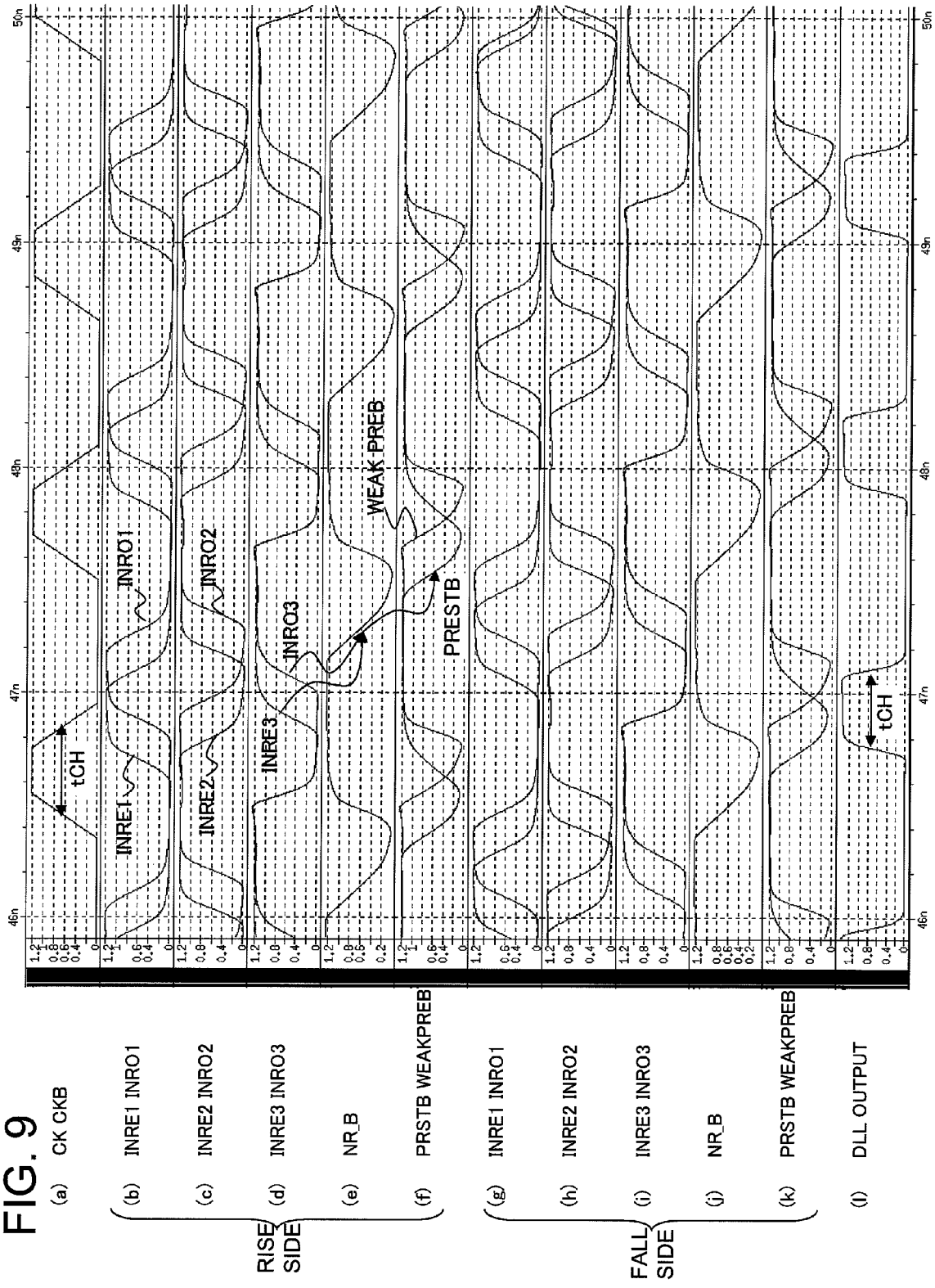

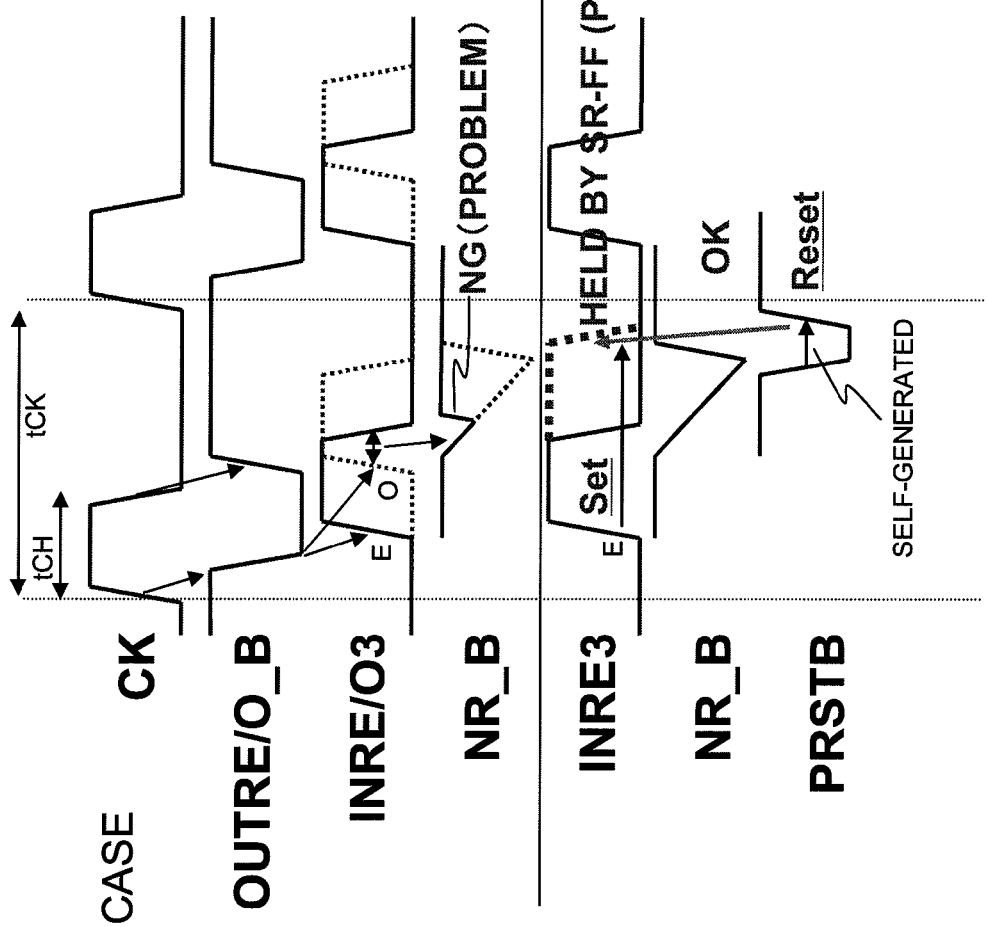

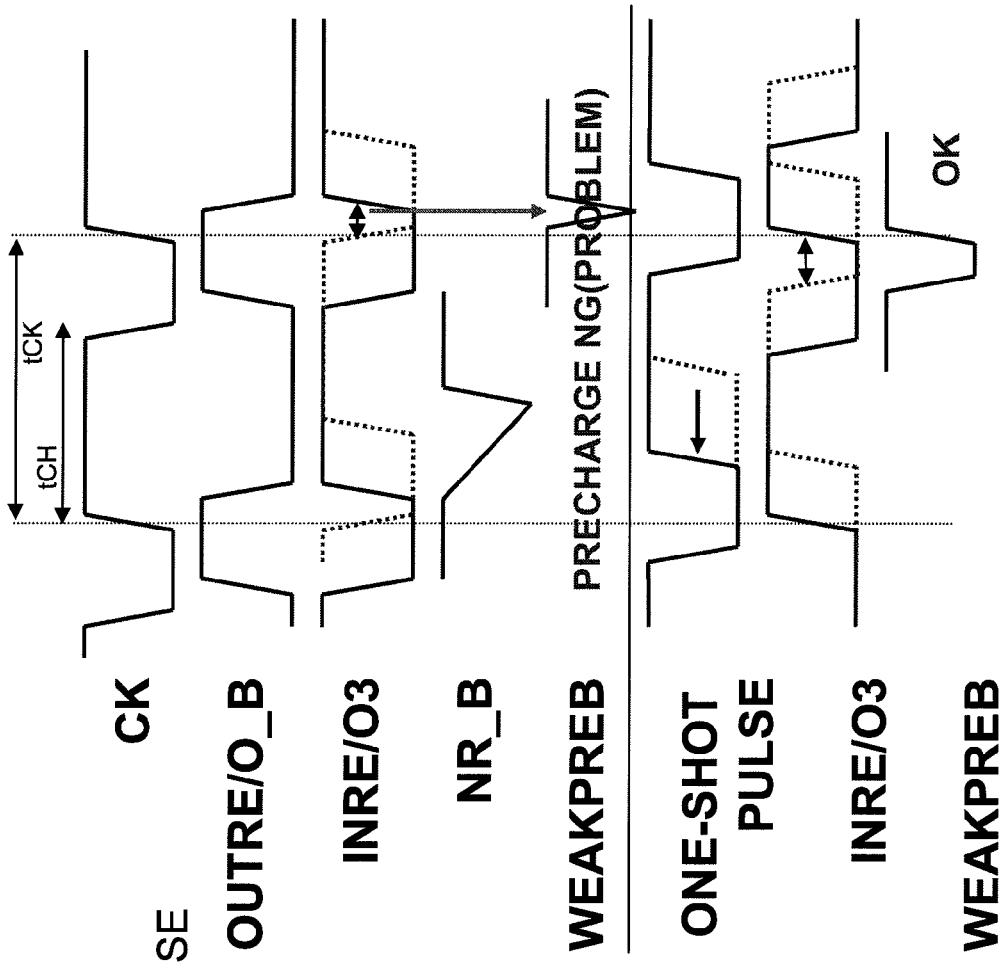

DLL CIRCUIT AND CONTROL METHOD THEREFOR

REFERENCE TO RELATED APPLICATION

This application is based upon and claims the benefit of the priority of Japanese patent application No. 2008-227324 filed on Sep. 4, 2008, the disclosure of which is incorporated herein in its entirety by reference thereto.

FIELD OF THE INVENTION

This invention relates to a DLL (Delay Locked Loop) circuit and a semiconductor device including the DLL circuit. More particularly, it relates to a DLL circuit capable of performing a fast clocking operation, and a semiconductor device including the DLL circuit.

BACKGROUND

A DLL (Delay Locked Loop) circuit includes a delay circuit whose delay time can be variably controlled, a phase detector that compares an output of the delay circuit and an input signal supplied to the delay circuit, and a counter that counts up or down based on a result of phase comparison by the phase detector. The delay time by the delay circuit is adjusted to pull the output of the delay circuit into synchronization with the input signal to the delay circuit, based on a count value or on the result of decoding by the counter. As such a DLL circuit, there is known a configuration including a variable delay circuit and a synthesizing circuit, also termed an interpolation circuit or an interpolator. The variable delay circuit effects coarse delay adjustment and the interpolation circuit effects fine delay adjustment. Specifically, the variable delay circuit sets the delay time with a coarser delay resolution (delay time unit) and the synthesizing circuit synthesizes the phase difference (delay) between two signals with different delay time values, generated by the variable delay circuit, in accordance with a preset synthesis ratio, thereby generating a delay signal higher in resolution than the delay time unit of the variable delay circuit. The synthesizing circuit (interpolator) performs internal division of the delays of the two signals to output a signal of intermediate delay, and includes a precharging circuit and first and second discharge elements. The precharging circuit precharges a preset node beforehand to a prescribed voltage. The first and second discharge elements are turned on (i.e., made conductive) during a HIGH period of first and second input signals to discharge the precharged node to current values of XI and (1−X)I related with an internal division ratio X:(1−X), where $0 \leq X \leq 1$. As regards the detailed configuration of the synthesizing circuit (interpolator) that synthesizes the two signals (Even and Odd) of different delay time values from the variable delay circuit, as well as the detailed configuration of the DLL circuit, see Patent Document 1, for instance.

Recently, operating frequencies of semiconductor circuits have increased significantly. Hence, in a DLL circuit that controls the delay of a high speed clock, duty offset, for example, is becoming a significant problem. Patent Document 2 has disclosed a digital DLL circuit capable of separately controlling delays on rising and falling of a signal and also capable of compensating for a clock duty offset or the rise/fall delay difference of a data signal. The circuit configuration of the DLL circuit disclosed is such that a variable delay circuit (D0_R variable delay circuit) delays an input signal (data) with a delay corresponding to a rising delay control value provided by a control circuit. A one-shot pulse is generated from a delayed output of the variable delay circuit and supplied to a set terminal of an SR flip-flop. A variable delay circuit (D0_F variable delay circuit) delays an input signal (data) with a delay corresponding to the fall delay control value supplied by the control circuit. A one-shot pulse is generated from a delayed output of the variable delay circuit and supplied to a reset terminal of an SR flip-flop. A delayed output is derived from an output of the SR flip-flop.

Patent Document 3 discloses a configuration of a semiconductor integrated circuit device for generating a clock, whose delay time and duty ratio may be made selectable, without causing jitter deterioration. With this configuration, two clocks from the DLL circuit are used to determine the rising and falling edges of a generated clock. The delay time of the two clocks from the DLL circuit are made selectable. The two clocks selected are supplied to two inputs of the clock synthesis circuit including D-flip-flops that receives two inputs. The timing of the rising and falling edges of the output clock is determined by the rising edges of the two input clocks based on the function of a phase frequency comparator. Thus, by optionally selecting the phase (delay time) of the two input clocks, an output clock is derived that has a desired duty ratio and a desired delay time value.

[Patent Document 1] JP Patent Kokai Publication No. JP-P2003-91331A, corresponding to US 2003/052718, now U.S. Pat. No. 6,674,314 (FIGS. 1 and 3)

[Patent Document 2] JP Patent Kokai Publication No. JP-P2007-228044A, corresponding to US 2007/194824 (FIG. 4)

[Patent Document 3] JP Patent Kokai Publication No. JP-P2008-136031A (FIG. 2)

The entire disclosures of Patent Documents 1 to 3 are incorporated herein by reference thereto.

SUMMARY

A DLL circuit, used in a DRAM (Dynamic Random Access Memory), operates in response to an externally supplied clock (CK). With increase of clock speed, the duty ratio of the clock, that is, the ratio of the HIGH clock pulse width to the cycle period, becomes increasingly crucial or critical to device operation.

For example, suppose that, in a DLL circuit having a synthesizing circuit (interpolator) that synthesizes two delay signals of different delay time values, output from a variable delay circuit, at a preset synthesis ratio, the HIGH clock pulse width is short, and the delay signal has come in with a delay to approach to the output timing. In such case, the next precharging is initiated at a pre-charged node of the synthesis circuit (interpolator) when as yet the pre-charged node is not fully LOW. As a result, the synthesizing circuit (interpolator) may not operate properly (see FIG. 10A). On the other hand, if the HIGH pulse period of the clock is long and the delay signal has come in with a delay so that the HIGH pulse period extends to the next cycle, the node may be precharged at the start of the next cycle. In such a case, the synthesis circuit (interpolator) may not operate properly (see FIG. 11A). This will be discussed later in detail in conjunction with an embodiment of the present invention.

To solve the above problem, the invention disclosed in the present Application may be summarized substantially as follows:

According to the present invention, there is provided a DLL circuit including, at an input stage to a synthesis circuit (interpolator) that synthesizes, in accordance with a prescribed ratio, first and second delay signals that are output from a variable delay circuit and have respective different delay time values, a pair of circuits that generate one-shot pulses in response to prescribed transition of the delay signals, and a pair of latch circuits that are reset based on outputs of the synthesis circuit (interpolators). Output signals at the set time of the pair latch circuits are supplied to the synthesis circuit (interpolator).

According to an embodiment of the present invention, there is provided a DLL circuit comprising a first variable delay circuit, a pair of second variable delay circuits and a first synthesis circuit. The first variable delay circuit receives an external signal and variably sets delay time of the external signal with a prescribed delay time unit. The first variable delay circuit then outputs first and second delay signals of a first set with different delay time values, in association with a first transition of the external signal, and outputs first and second delay signals of a second set with different delay time values, in association with a second transition of the external signal. The pair of second variable delay circuits is provided in association with the first and second delay signals of the first set and in association with the first and second delay signals of the second set. The pair of second variable delay circuits receive the first and second delay signals of the sets associated therewith to output delay signals the delay time of which has been set with finer resolution than the delay time unit of the first variable delay circuit. The first synthesis circuit synthesizes an output signal based on the delay signals output from the pair of second variable delay circuits. The pair of second variable delay circuits each includes first and second one-shot pulse generating circuits each generating a one-shot pulse in response to transitions of the first and second delay signals, first and second set-reset latch circuits that are set in response to the one-shot pulses, and a second synthesis circuit. The second synthesis circuit receives outputs of the first and second latch circuits as first and second inputs, respectively, and outputs a signal which is a synthesis of the first and second inputs at a prescribed ratio. The first and second latch circuits are reset based on an output of the second synthesis circuit.

Some of the advantages of various embodiments of the present invention are summarized as follows.

According to the present invention, malfunctions of the synthesis circuits may be prohibited both in case the clock pulse width is narrow and in case the clock pulse width is broad, thus allowing for and accommodating increases in operating frequency.

Still other features and advantages of the present invention will become readily apparent to those skilled in this art from the following detailed description in conjunction with the accompanying drawings wherein only exemplary embodiments of the invention are shown and described, simply by way of illustration of a best mode contemplated of carrying out this invention. As will be realized, the invention is capable of other and different embodiments, and its several details are capable of modifications in various obvious respects, all without departing from the spirit and scope of the present invention. Accordingly, the drawing and description are to be regarded as illustrative in nature, and not as restrictive.

BRIEF DESCRIPTION OF THE DRAWINGS

FIG. 9 is a timing waveform diagram for illustrating the operation of an embodiment of the present invention.

FIGS. 10A and 10B are waveform diagrams for illustrating the operation of the present invention including an SR (set-reset or s/r) latch in comparison with that of a comparative example.

FIGS. 11A and 11B are waveform diagrams for illustrating the operation of the present invention including a one-shot pulse generating circuit in comparison with that of a comparative, alternate example.

DETAILED DESCRIPTION

According to a embodiment of the present invention, there is provided a DLL circuit including, in addition to a variable delay circuit and a synthesis circuit (interpolator) which synthesizes, at a preset synthesis ratio, two delay signals of respective different delay time values output from the variable delay circuit, circuits which generate respective one-shot pulses in response to prescribed transitions of the two delay signals supplied to the synthesis circuit (interpolator), and latch circuits which are set responsive to the respective one shot pulses and reset based on the output from the interpolator. Output signals at the set time of the latch circuits are supplied to the synthesis circuits (interpolator).

The variable delay circuit and the synthesis circuit (interpolator) both are equipped with time adjustment functions. The synthesis circuit (interpolator) effects fine delay adjustment, whilst the variable delay circuit effects coarse delay adjustment with a resolution less fine than that of the synthesis circuit (interpolator).

Figure 2:
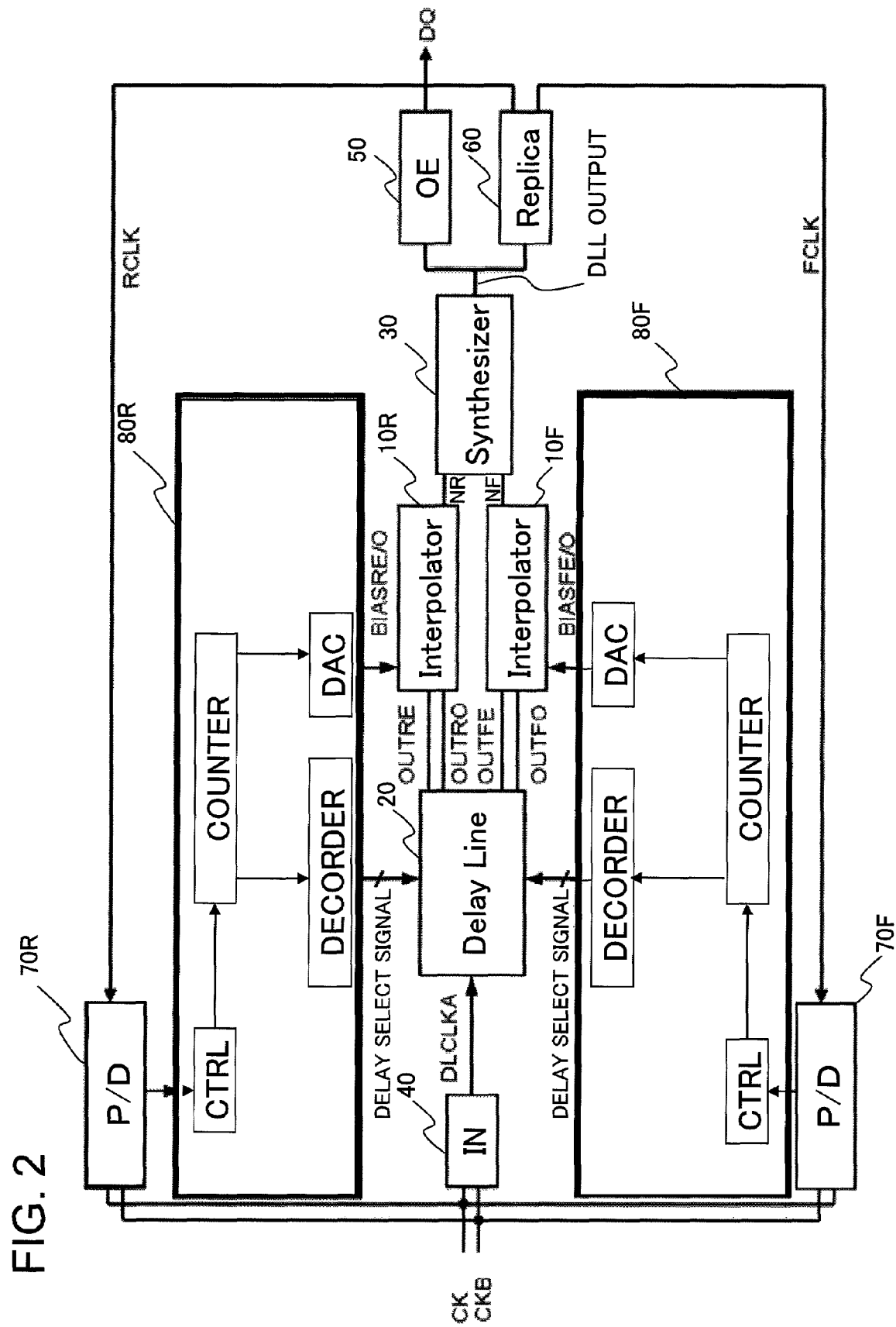
FIG. 2 is a schematic diagram showing a configuration of a DLL (delay locked loop) of an embodiment of the present invention.

More specifically, according to an embodiment of the present invention, the DLL includes, as shown in FIG. 2, a first variable delay circuit (20), a second variable delay circuit (interpolator) (OR), a second variable delay circuit (interpolator) (10F), and a first synthesis circuit (30). The first variable delay circuit receives an external signal (CK), variably sets delay time of the external signal with a prescribed delay time unit, and produces first and second delay signals (OUTRE, OUTRO) with different delay time values from a first transition (Rise) of the external signal. The first variable delay circuit also produces first and second delay signals (OUTFE, OUTFO) with different delay time values from a second transition (Fall) of the external signal.

The second variable delay circuit (interpolator) (10R) receives the two signals (OUTFE, OUTFO) associated with a first transition (Rise) of the external signal (CK) and synthesizes delay differences (phase differences) of the two signals (OUTRE, OUTRO) at a prescribed ratio to output the delay synthesized signal (NR).

The second variable delay circuit (interpolator) (10F) receives two signals (OUTFE, OUTFO) associated with a second transition (Fall) of the external signal (CK) and synthesizes delay differences (phase differences) of the two signals (OUTRE, OUTRO) at a prescribed ratio to output the delay synthesized signal (NF). The first synthesis circuit (30) synthesizes output signals (NR, NF) of the second variable delay circuits (10R, 10F).

The first variable delay circuit (Delay Line) effects coarse delay adjustment (adjustment of a time delay with coarse resolution), whilst the second variable delay circuits (Interpolators) effect fine delay adjustment (adjustment of a time delay with resolution finer than with the first variable delay circuit).

Figure 3:
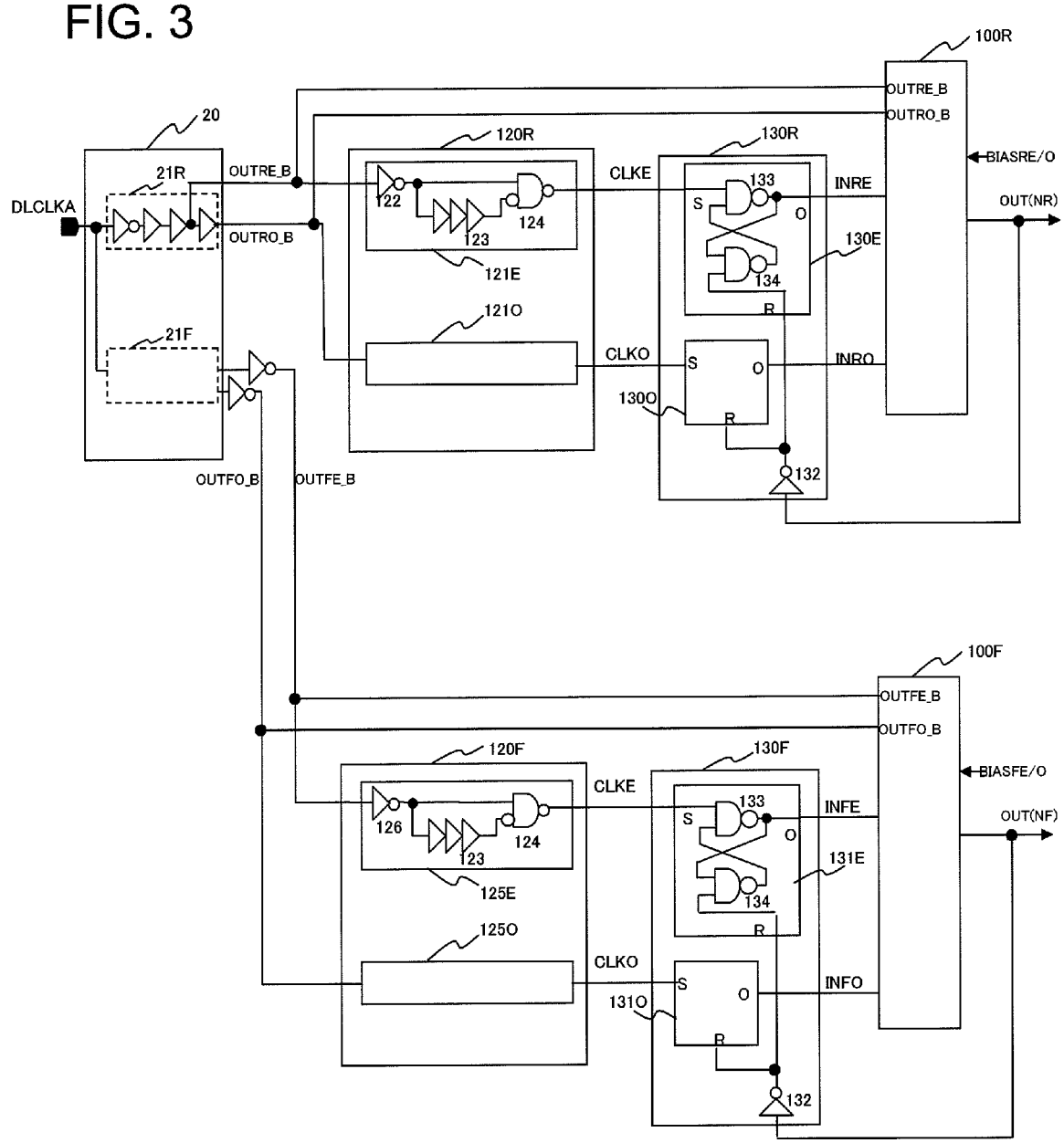
FIG. 3 is a circuit diagram showing a configuration of a first variable delay circuit (delay line) and a second variable delay circuit (interpolator) of an embodiment of the present invention.

According to an embodiment of the present invention, the second variable delay circuit (10R), as shown in FIG. 3, includes a one-shot pulse generating circuit (120R) which comprises first and second one-shot pulse generating circuits (121E, 121O), a latch circuit (130R) which comprises first and second latch circuits (130E, 130O), and a second synthesis circuit (100R). The first and second one-shot pulse generating circuits (121E, 121O) respectively generate one-shot pulses in response to prescribed transition edges of two delay signals (OUTRE_B, OUTRO_B) generated by the first variable delay circuit (20) in association with the first transition (Rise) of the external signal. The first and second latch circuits (130E, 130O), each of which includes a set terminal (S), and a reset terminal (R), are respectively set by one-shot pulses (CLKE, CLKO), which are produced respectively from the first and second one-shot pulse generating circuits (121E, 121O) and supplied to the set terminals (S). The second synthesis circuit (100R) receives transition edges of outputs at the set time of the first and second latch circuits (130E, 130O) and synthesizes a delay difference (a phase difference) between the transition edges at a prescribed ratio which is set by the bias voltages (BIASRE, BIASRO). An output signal (NR) of the second synthesis circuit (100R) is used in common as a reset signal for the first and second latch circuits (130E, 130O).

In FIG. 3, OUTRE_B and OUTRO_B denote values inverted from OUTRE and OUTRO of FIG. 2, respectively. The two delay signals OUTRE_B and OUTRO_B output from the first variable delay circuit (20) transition from HIGH to LOW in association with transition (Rise) from LOW to HIGH of the external clock (CK).

The second variable delay circuit (10F) is configured similarly to the second variable delay circuit (10R). Thus, the second variable delay circuit includes a one-shot pulse generating circuit (120F), which comprises first and second one-shot pulse generating circuits (125E, 125O), a latch circuit (130F) which comprises first and second latch circuits (131E, 131O), and a second synthesis circuit (100F). The first and second one-shot pulse generating circuits (125E, 125O) respectively generate one-shot pulses in response to prescribed transition edges of two delay signals (OUTFE_B, OUTFO_B) generated by the first variable delay circuit (20) in association with the second transition (Fall) of the external signal CK). The first and second latch circuits (131E, 131O), each of which includes a set terminal (S) and a reset terminal (R), are set by one-shot pulses (CLKE, CLKO), which is output respectively from the first and second one-shot pulse generating circuits (125E, 125O) and supplied to the set terminals (S). The second synthesis circuit (100F) receives transition edges of output signals at the set time of the first and second latch circuits (131E, 131O) and synthesizes a delay difference (a phase difference) between the transition edges at a prescribed ratio. An output signal (NF) of the second synthesis circuit (100F) is used in common as a reset signal for the latch (130F) provided with the first and second latch circuits (131E, 131O).

Figure 4:
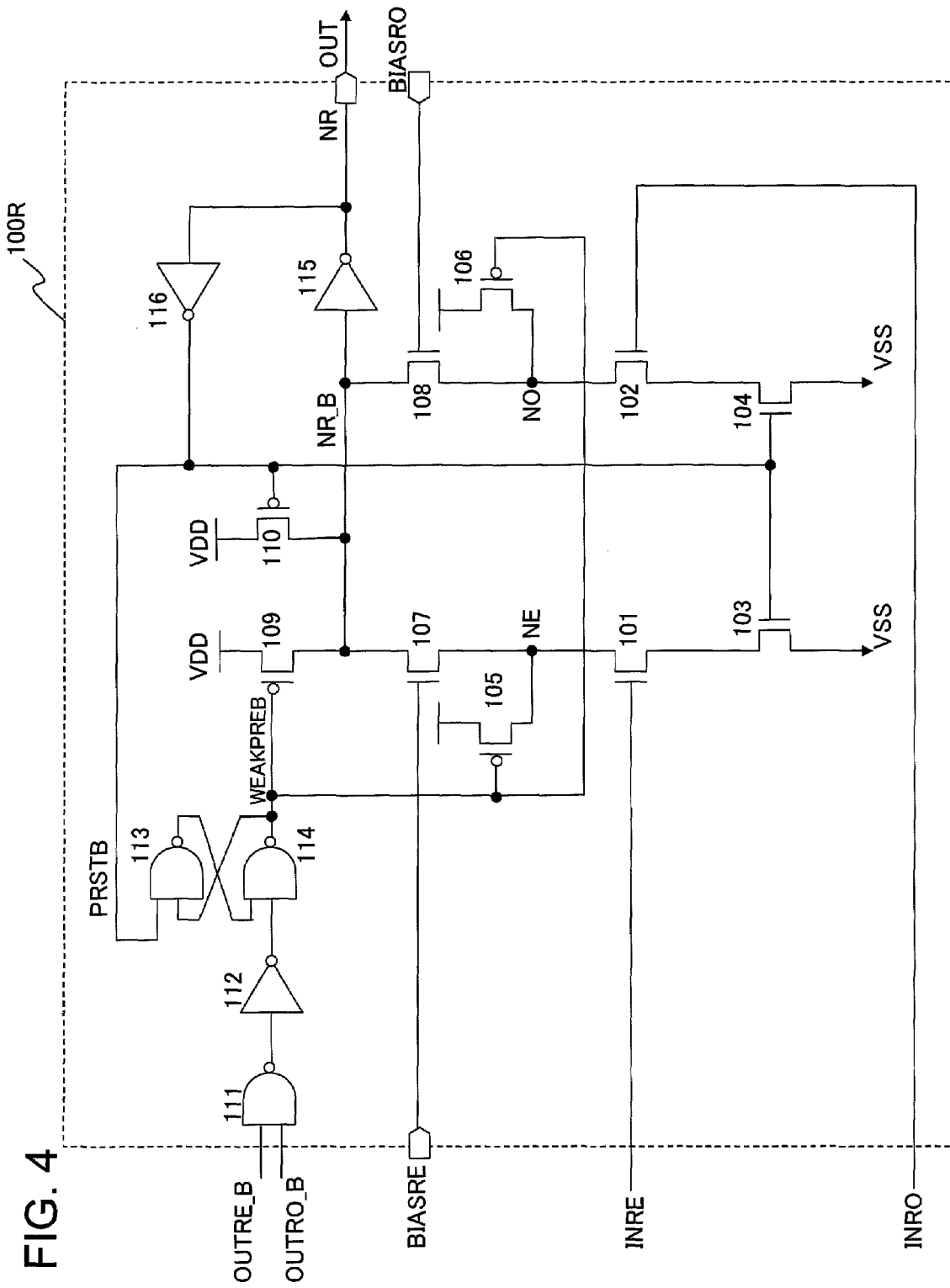
FIG. 4 is a circuit diagram showing a second synthesis circuit of an embodiment of the present invention.

According to an embodiment of the present invention, the second synthesis circuit (100R) includes, referring to FIG. 4, a pre-reset circuits (109, 110), each including PMOS transistor 109 and 110, respectively, first and second inputs (INRE, INRO), first and second transistors (101, 102) including NMOS transistor 101 and NMOS transistor 102, respectively, first and second delay control circuits (107, 108) each including a respective NMOS transistor 107 or 108, first logic circuit (115) including an inverter, a second logic circuit (116) also comprising an inverter, a third logic circuit (111, 112) comprising a series connection of NAND circuit 111 and inverter 112, and a third latch circuit (113, 114) comprising cross-coupled NAND circuits 113 and 114. The pair of pre-reset circuits (109, 110) include respective precharge PMOS transistors 109 and 110 that are connected between a first power supply (VDD) and a node (NR_B) and reset the node (NR_B) to a prescribed voltage. The first and second transistors (101, 102) are connected between the node (NR_B) and a second power supply (VSS) and have control terminals connected to the first and second inputs (INRE, INRO), respectively. The first and second inputs (INRE, INRO) receive outputs of the first and second latch circuits (130E, 130O) each including a respective set-reset or s/r latch circuit 130E or 130O ("E" and "O" designating even and odd, respectively.) The first and second transistors (101, 102) are turned on (i.e., biased so as to be made conductive) and off (i.e., biased as to be made non-conductive), when the first and second latch circuits (130E, 130O) are set and reset, respectively. The first and second delay control circuits (107, 108) are connected between the node (NR_B) and the second power supply (VSS) in series with the first and second transistors (101, 102), respectively and cause current values corresponding to the ratio of the synthesis to flow. The first logic circuit (115) receives the voltage of the node (NR_B) at its input to deliver an output signal to an output terminal (OUT) of the synthesis circuit. The second logic circuit (116) receives an output signal (NR) of the first logic circuit (115) and outputs a signal for reset (PRSTB) when the output signal (NR) of the first logic circuit (115) is of a prescribed value. The third logic circuit (111, 112) receives the first and second delay signals (OUTRE_B, OUTRO_B) and outputs a signal for set when at least one of the first and second signals is of a prescribed value. The third latch circuit (113, 114) whose set terminal receives the signal for set that is output from the third logic circuit (111, 112) and whose reset terminal receives the signal for reset (PRSTB) that is output from the second logic circuit (116). The pre-reset circuits (109, 110) includes a first pre-reset element (110) that sets the node (NR_B) to a prescribed voltage in response to the signal for reset (PRSTB) output from the second logic circuit (116) and a second pre-reset element (109) that sets the node (NR_B) to a prescribed voltage when an output (WEAKPREB) of the third latch circuit (113, 114) is in a reset state.

The second synthesis circuit (100R) further includes third and fourth pre-reset elements (105, 106) that, when the output (WEAKPREB) of the third latch circuit (113, 114) is in a reset state, resets a connection node (NE) of the first delay control circuit (107) and the first transistor (101) and a connection node (NO) of the second delay control circuit (108) and the second transistor (102) to the same voltage as that at the node (NR_B). The second synthesis circuit (100R) further includes a third transistor (103) connected between the first transistor (101) and the second power supply (VSS) and a fourth transistor (104) connected between the second transistor (102) and the second power supply (VSS). The control terminals of the third and fourth transistors (103, 104) receive the signal for reset (PRSTB) output from the second logic circuit (116) in common. This causes the third and fourth transistors to be controlled to be turned on (conductive) or off (non-conductive).

According to an embodiment of the present invention, the second synthesis circuit (100F) for the second transition (Fall) is configured similarly to the second synthesis circuit (100R) for the first transition (Rise).

Figure 7:
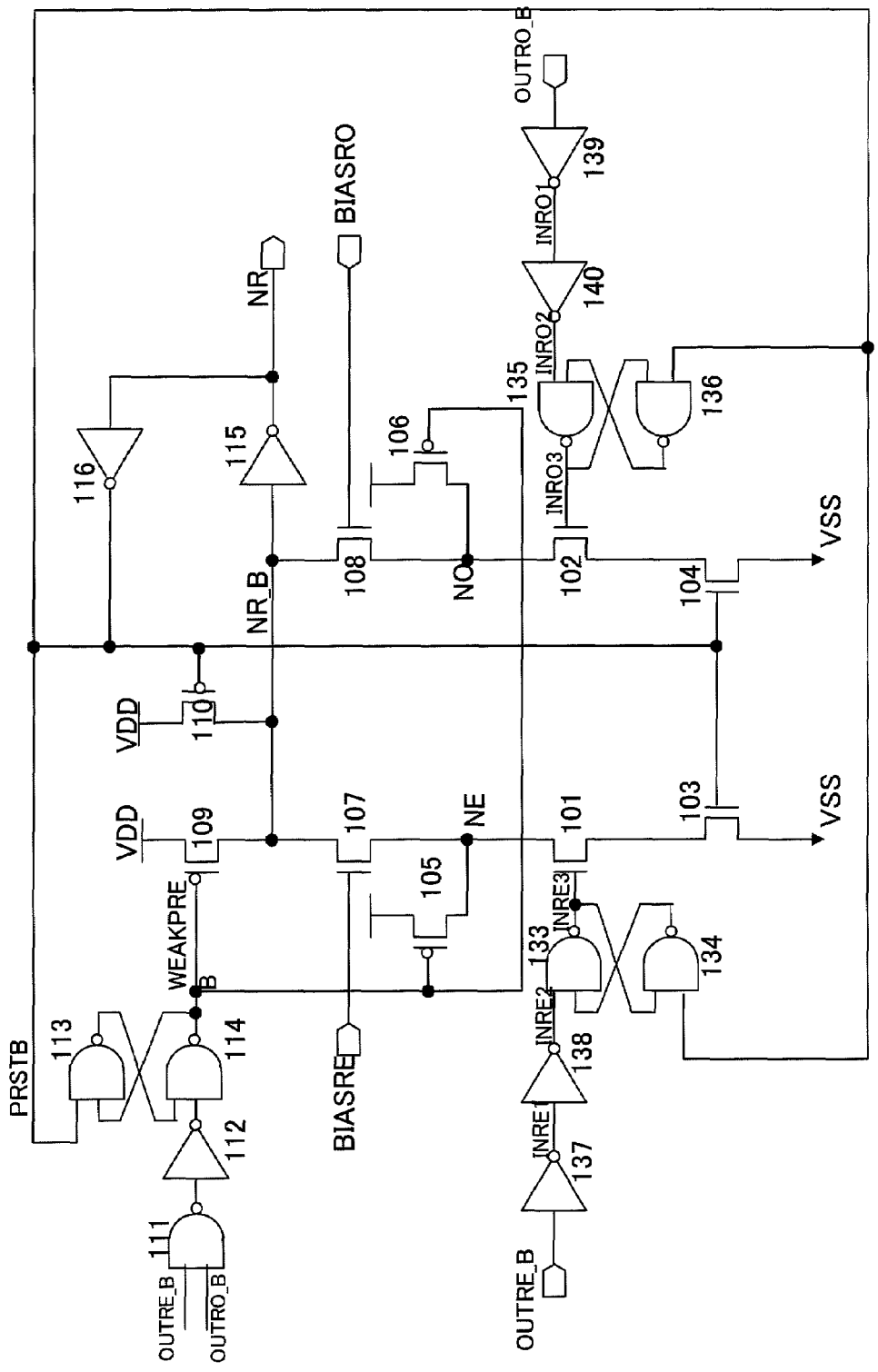
FIG. 7 is a circuit diagram showing an example configuration including first and second latch circuits and a second synthesis circuit of an embodiment of the present invention.

According to an embodiment of the present invention and with reference to FIGS. 4 and 7, the second synthesis circuit (100R) receives first and second delay signals, generated by the variable delay circuit (20), and having delay difference in transition from a first value to a second value, and synthesizes the two delay signals at a preset synthesis ratio to output the resulting signal. The second synthesis circuit includes the aforementioned first and second latch circuits. More specifically, the second synthesis circuit includes a pre-reset circuit (109, 110) including precharge PMOS transistors 109 and 110, a first latch circuit (133, 134) including cross-coupled NAND circuits 133 and 134, a second latch circuit (135, 136) including cross-coupled NAND circuits 135 and 136, first and second transistors (101, 102), first and second delay control circuits (107, 108) including respective NMOS transistors 107 and 108, a first logic circuit (115) including inverter 115, a second logic circuit (116) including inverter 116, a third logic circuit (111, 112) including a series connection of NAND circuit 111 and inverter 112, and a third latch circuit (113, 114) including cross-couled NAND circuits 113 and 114. The first latch circuit (133, 134) receives a first delay signal (OUTRE_B) at its set terminal and is set based on a second value of the first delay signal. The second latch circuit (135, 136) receives a second delay signal (OUTRO_B) at its set terminal and is set based on a second value of the second delay signal. The pre-reset circuit (109, 110) is connected between the first power supply (VDD) and a node (NR_B) and resets the node (NR_B) to a prescribed voltage. The first and second transistors (101, 102) are connected between the node (NR_B) and the second power supply (VSS) and receive outputs of the first latch circuit (133, 134) and the second latch circuit (135, 136) at their control terminals. The first and second transistors (101, 102) are turned on (conductive) when the first and second latch circuits are set and are turned off (non-conductive) when the first and second latch circuits are reset.

The first and second delay control circuits (107, 108) are connected between the node (NR_B) and the second power supply (VSS) in series with the first and second transistors (101, 102), respectively, and are adapted to cause the currents proportionate to the synthesis ratio to flow.

The first logic circuit (115) receives a voltage at the node (NR_B) at its input and outputs a synthesized signal at its output. The second logic circuit (116) receives an output of the first logic circuit (115) and outputs a signal for reset.

The third logic circuit (111, 112) receives first and second delay signals (OUTRE_B, OUTRO_B) and outputs a signal for set output when at least one of the first and second delay signals is of the second value.

The third latch circuit (113, 114) receives a signal for set, output from the third logic circuit (111, 112), at its set terminal, and also receives the signal for reset, output from the second logic circuit (116).

The pre-reset circuit (109,110) includes a first pre-reset element (110) and a second pre-reset element (109). The first pre-reset element (110) sets the node (NR_B) at a prescribed voltage in response to the signal for resetting (PRSTB) output from the second logic circuit (116). The second pre-reset element (109) sets the node (NR_B) at a prescribed voltage when the output (WEAKPREB) of the third latch circuit (113, 114) is in a reset state.

In one embodiment of the present invention, there are provided a memory cell array (1-1), a memory control circuit (1-13) having an access circuit for the memory cell array, and a DLL circuit (1-12) that determines the input/output timing of the memory cell array. The DLL circuit is formed by the above-described DLL circuit.

Figure 1:
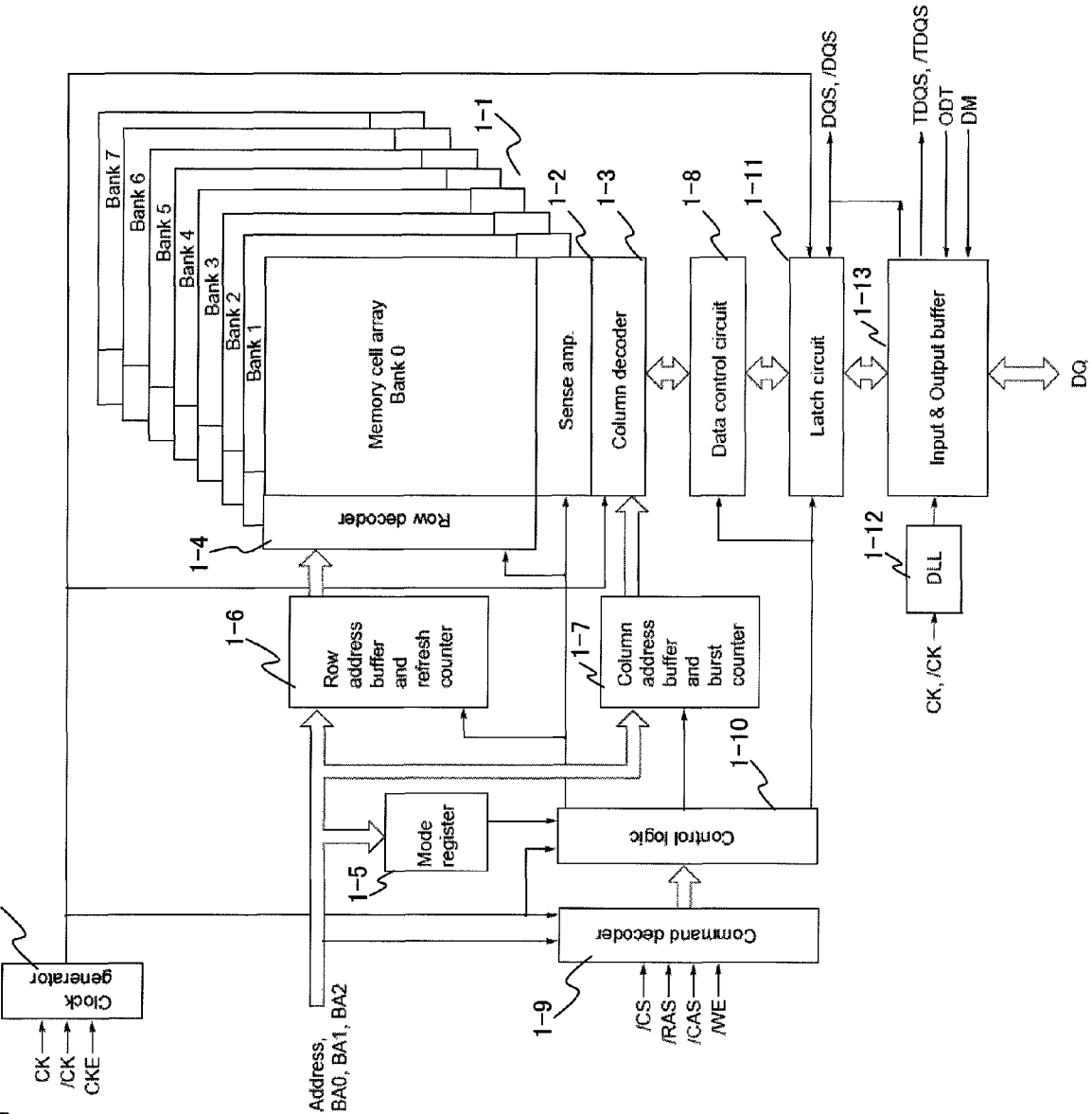
FIG. 1 is a schematic diagram showing a configuration of a memory device according to an embodiment of the present invention.

FIG. 1 shows an overall or a global configuration of a DRAM device on which a DLL according to the present invention is provided. The DRAM device of FIG. 1 is a DDR (Double Data Rate) SDRAM (Synchronous DRAM) of an eight memory bank configuration. The DDR SDRAM is such an SDRAM that that exchanges data in synchronization with both rising and falling edges of a clock. Referring to FIG. 1, a row decoder 1-4 decodes a row address to drive a selected word line, not shown. A sense amplifier 1-2 amplifies data read out on a bit line, not shown, of a memory cell array 1-1. During refresh, the sense amplifier amplifies data read out on a bit line connecting to a cell of a word line selected by a refresh address, and writes the cell data back to the cell. A column decoder 1-3 decodes a column address to make a selected Y-switch on (conductive), not shown, to connect the selected bit line to an IO line, not shown. A command decoder 1-9 receives a prescribed address signal and a chip select signal /CS, a row address strobe signal /RAS, a column address strobe signal /CAS and a write enable signal /WE to decode a command. A character / of a signal name indicates that the signal is a LOW active signal. A column address buffer-burst counter 1-7 generates, starting from the input column address, addresses the number of which corresponds a burst length, under control by a control logic 1-10 that receives a control signal from the command decoder 1-9, and delivers the so generated addresses to the column decoder 1-3. A mode register 1-5 receives an address signal and bank selection signals BA0, BA1 and BA2 to output a control signal to the control logic 1-10. The bank selection signals are used to select one of the eight banks.

A row address buffer of a row address buffer-refresh counter 1-6 receives an input row address to output it to the row decoder 1-4. Its refresh counter receives a refresh command to perform a count-up operation to deliver a count output as a refresh address. The row address from the row address buffer and the refresh address from the refresh counter are supplied to a multiplexer, not shown. During refresh, the refresh address is selected and, otherwise, the row address from the row address buffer is selected. The so selected address is supplied to the row decoder 1-4.

The clock generator 1-14 receives complementary external clocks CK and/CK supplied to the DRAM device, and produces an internal clock in case a clock enable signal CKE is HIGH. When the clock enable signal CKE is LOW, the supply of an internal clock from clock generator 1-14 is stopped.

A data control circuit 1-8 inputs/outputs write data and readout data. A latch circuit 1-11 latches the write data and the readout data. An input/output buffer 1-13 inputs/outputs data at a data terminal DQ. A DLL 1-12 generates a signal, delay-synchronized with respect to the external clocks CK, /CK, to deliver the so generated clocks to the input/output buffer 1-13. Readout data from the memory cell array 1-1 is delivered from the latch circuit 1-11 to the input/output buffer 1-13. The latter outputs the readout data from the data terminal DQ at a double data rate, using rising and falling edges of the clock signal synchronized with the external clock CK by the DLL 1-12.

DM is a data mask signal for write data, which is written during write when the data mask signal is HIGH. DQS and /DQS are differential data strobe signals that prescribe the timings of data write and data readout. They are I/O signals, that is, an input signal during write and an output signal during readout. TDQS and /TDQS are differential signals that provide for compatibility of the X8 data configuration with the X4 data configuration. ODT (On-Die Termination) is a control signal that turns terminal resistances of DQ, DQS, /DQS, TDQS and /TDQS on or off. FIG. 1 schematically shows a typical example of a DRAM device which is not intended to restrict the scope of the present invention which is applicable to and usable with varied other types and configurations of devices.

FIG. 2 schematically shows an example of the configuration of the DLL shown in FIG. 1. An input circuit (IN) 40 receives complementary external clocks CK and CKB to output a clock signal DLCLKA as a single end signal. The clock signal DLCLKA is in phase with the clock CK. In FIG. 2, CK and CKB corresponds to CK and /CK in FIG. 1, respectively.

A first variable delay circuit (Delay Line) 20 receives, as selection control signals, outputs of counters (COUNTERs) of phase adjustment circuits 80R and 80F, and determines which of delay taps of the first variable delay circuit (Delay Line) 20 is to be used.

The first variable delay circuit (Delay Line) 20 generates, for the rise (Rise) of the clock signal DLCLKA, an even delay signal (OUTRE) and an odd delay signal (OUTRO), from an even-numbered delay tap and an odd-numbered delay tap, respectively. The even-numbered delay signal corresponds to an output of an even-numbered delay tap and the odd-numbered delay signal corresponds to an output of an odd-numbered delay tap next following the even-numbered delay tap. The first variable delay circuit (Delay Line) 20 also generates, for the fall of the clock signal DLCLKA, an even-numbered delay signal (OUTFE) and an odd-numbered delay signal (OUTFO), providing two delay signals. In this case, output signals of one stage of inverters, through which the two delay signal outputs of the variable delay circuit (21F of FIG. 3) are transmitted, respectively, are two delay signals (OUTFE, OUTFO). The reason is that rising edges of two delay signals (OUTFE, OUTFO) are generated in correspondence with the falling edge of the clock signal DLCLKA and the first variable delay circuit (20) is shared by the succeeding circuits (10R, 10F). The first variable delay circuit (Delay Line) 20 variably sets the delay time, with the time difference between Even and Odd as being the minimum delay time unit (delay time of the unit delay circuit). The time difference of the delay signals Even and Odd (delay time of the unit delay circuit) corresponds to two stages of inverter of the variable delay circuit (Delay Line). This minimum delay time unit of the first variable delay circuit (20) is coarser than the minimum delay time unit of second variable delay circuits (interpolator) (10R,10F) now described.

A second variable delay circuit (interpolator) 10R receives the Even and Odd delay signals (OUTRE, OUTRO) of respective different delay time values which are generated from the rising edges of the clock signal DLCLKA in the first variable delay circuit (Delay line) 20, and synthesizes the delay time values based on a ratio controlled by a bias signal BIASRE/O as output from the phase adjustment circuit 80R. For example, if the ratio of duty cycles is 100% for the Even side and 0% for the Odd side, a waveform is synthesized with OUTRE=100% and OUTRO=0% and an output NR is generated at such a timing that the rise timing of the OUTRE corresponds to the rise timing of the output NR. If the ratio of duty cycles is 50% for the Even side and 50% for the Odd side, a waveform is synthesized with OUTRE=50% and OUTRO=50% so that the output NR is output at a mid timing between OUTRE and OUTRO. The second variable delay circuit (interpolator) 10R is able to adjust the delay with a time resolution finer than the minimum delay time unit of the first variable delay circuit 20 (absolute delay time value of two NAND stages), and hence is able to operate at higher resolution and higher frequencies.

A second variable delay circuit (interpolator) 10F receives the Even and Odd delay signals (OUTFE, OUTFO) of respective different delay time values, generated from the fall edges of the clock signal DLCLKA in the first variable delay circuit (Delay Line) 20, and synthesizes the delay time values based on the ratio controlled by the two bias signals BIASFE/O as output from the phase adjustment circuit 80F.

As two bias signals BIASRE/O for the Even and Odd signals, supplied to the second variable delay circuit (interpolator) 10R, the output voltages of a digital/analog converter (DAC) that receives an output signal of a counter (COUNTER) of the phase adjustment circuit 80R and convert it to an analog signal, may be used.

In similar manner, as the bias signals BIASFE/O for the Even and Odd signals, supplied to the second variable delay circuit (interpolator) 10F, the output voltages of a digital/analog converter (DAC) that receives an output signal of a counter (COUNTER) of the phase adjustment circuit 80F to convert it to an analog signal, may be used. In generating two bias voltages (BIASRE/BIASRO) with a single digital/analog converter (DAC), it is possible to differentially generate the currents corresponding to lower bits of the counter (Counter). The differential current thus generated may then be converted to a voltage to generate BIASRE/BIASRO, although this is merely illustrative and is not intended to limit the present invention. Or, with the bias voltage for Even, that is, BIASRE, being set so as to be VCM+$\Delta$V/2, and with the bias voltage for Odd, that is, BIASRO, being set so as to be VCM−$\Delta$V/2, where VCM is a common voltage and BIASRE−BIASRO=$\Delta$V. The voltage $\Delta$V may be generated in a register with lower bits of the counter (Counter). ½ of $\Delta$V may then be added to or subtracted from VCM.

A first synthesis circuit (synthesizer) 30 inputs an output signal NR from the second variable delay circuit (interpolator) 10R and an output signal NF from the second variable delay circuit (interpolator) 10F, and synthesizes them together to generate a DLL output. The output signal NR rises in response to the rising edge of CK, and that the output signal NF rises in response to the falling edge of CK. In the present embodiment, the first synthesis circuit (synthesizer) 30 is of a circuit configuration equivalent to a flip-flop formed by two inverter stages. The first synthesis circuit 30 is designed to high accuracy and high speed operation. It should be noted that this configuration is merely illustrative and is not intended to limit the scope of the invention. The output of first synthesis circuit 30 is set to HIGH responsive to a rise of the output NR and to LOW responsive to a rise of the output NF.

A delay replication circuit or replica 60 simulates an output DQ and has a delay equivalent to that of an actual signal route extending from a DLL output (output of the synthesis circuit 30) to the output data terminal DQ. Since it is sufficient for the replica 60 to replicate or simulate output delay, those circuit elements that are not essential may be deleted to simplify the circuit.

An output circuit (OE) 50 is provided in an input/output buffer 1-13 of FIG. 1, and serially outputs read data from a terminal DQ in synchronization with the rise and fall of an output signal (DLL output) from the first synthesis circuit (synthesizer) 30. The OE 50 includes a multiplexer that receives two read data, as inputs, for example, in parallel to select and output the input depending on the value of the DLL output.

A Rise side phase detector (P/D) (phase comparator) 70R detects the phase difference between the rising edge of a rise side clock RCLK and the rising edge of the external clock CK to output a detected result to the phase adjustment circuit 80R.

A Fall side phase detector (P/D) (phase comparator) 70F is similar in its configuration to the phase detector (P/D) (phase comparator) 70R, and detects the phase difference between the rising edge of a Fall side clock FCLK and the rising edge of an external clock CKB to output a detected result to the phase adjustment circuit 80F.

The phase adjustment circuit 80R includes a delay control circuit (CTRL), a counter (COUNTER), a decoder (DECODER) and a digital/analog converter (DAC). The delay control circuit (CTRL) receives the result of phase comparison at the rise side phase detector (P/D) 70R to output a control signal to cause the phase to lead in case of phase lag of RCLK or to cause the phase to lag in case of phase lead of RCLK. The counter (COUNTER) counts up or counts down based on the signal from the delay control circuit (CTRL). The decoder (DECODER) decodes prescribed upper bits of the counter to output a Rise side selection control signal of the variable delay circuit 20. The digital/analog converter (DAC) receives lower bits of the counter to deliver the bias signal BIASRE/O to the second variable delay circuit (interpolator) 10R. The Fall side phase adjustment circuit 80F is configured similarly to the phase adjustment circuit 80R.

FIG. 3 shows an example configuration of the first variable delay circuit 20 and the second variable delay circuits 10R and 10F according to an embodiment of the invention. Referring to FIG. 3, a one-shot pulse generating circuit 120R, a set-reset latch circuit 130R and a second synthesis circuit 100R make up the second variable delay circuit 10R of FIG. 2, whilst a one-shot pulse generating circuit 120F, a set-reset latch circuit 130F and a second synthesis circuit 100F make up the second variable delay circuit 10F of FIG. 2.

The first variable delay circuit 20 includes a variable delay circuit 21R for Rise transition and a variable delay circuit 21F for Fall transition. The variable delay circuits 21R and 21F receive selection control signals from the phase adjustment circuits 80R and 80F to select a delay device (Delay Line) that outputs a delay signal.

A suffix '–B' in each of OUTRE_B and OUTRO_B from the variable delay circuit 21R is so used because these are Even and Odd signals transitioning from HIGH to LOW in response to the rise from LOW to HIGH of the input clock signal DLCLKA.

The variable delay circuit 21F is configured similarly to the variable delay circuit 21R. An Even delay output signal OUTFE_B and an odd delay output signal OUTFO_B from the variable delay circuit 21F rise from LOW to HIGH in response to fall transition from HIGH to LOW of the input clock signal DLCLKA. A suffix '–B' in each of OUTFE_B and OUTFO_B from the variable delay circuit 21F is so used to indicate that these are signals inverted from the signals OUTFE and OUTFO, respectively. An example configuration of the variable delay circuit 21R is described subsequently in detail with reference to FIG. 5.

The one-shot pulse generating circuit 120R includes a one-shot pulse generating circuit 121E for Even and a one-shot pulse generating circuit 121O for Odd. These one-shot pulse generating circuits 121E and 121O are of the same configuration. The one-shot pulse generating circuit 121E includes an inverter 122, a delay circuit 123 that receives the output of the inverter 122, and NAND 124. The NAND 124 receives an output of the delay circuit 123 as an input of negative logic to output a LOW signal (one-shot pulse) CLKE during the time interval when the output of the inverter 122 is HIGH and the output of the delay circuit 123 is LOW. This time interval is equivalent to delay time of the delay circuit 123.

The one-shot pulse generating circuit 120F includes a one-shot pulse generation circuit 125E for Even and a one-shot pulse generation circuit 125O for Odd. These one-shot pulse generation circuits are of similar circuit configuration. The one-shot pulse generation circuit 125E includes an inverter 126, a delay circuit 123 that receives an output of the inverter 126, and a NAND 124. The NAND 124 receives an output of the delay circuit 123 as an input of negative logic to output a LOW signal (one-shot pulse) CLKE during the time duration when the output of the inverter 126 is HIGH and the output of the delay circuit 123 is LOW. This time duration corresponds to the delay time of the delay circuit 123. In the one-shot pulse generating circuit 121E, the input signal (OUTRE_B) is inverted by the inverter 122 to generate a one-shot pulse (LOW pulse) in response to the fall edge of the input signal (OUTRE_B). In the one-shot pulse generating circuit 125E, the input signal (OUTFE_B) is inverted by the inverter 126 to generate a one-shot pulse (LOW pulse) in response to the fall edge of the input signal (OUTFE_B).

The latch circuit 130R includes an SR latch circuit 130E for Even and an SR latch circuit 130O for Odd. These SR latch circuits 130E and 130O are of the same configuration. The SR latch circuit 130E includes a NAND 133 and a NAND 134. The NAND 133 has a first input coupled to a set terminal S that receives a CLKE from the one-shot pulse generating circuit 121E, and has its output (INRE) connected to a first input of the NAND 134 whose second input is connected to a reset terminal. An output of the NAND 134 is connected to the second input of the NAND 133. An output O (INRE) of the SR latch circuit 130E is supplied to the second synthesis circuit 100R. With this NAND SR (Set-Reset) latch, the output O is set to HIGH, when the set terminal S is LOW, with the reset terminal R being in HIGH state, whilst the output O is reset to LOW, when the reset terminal R is LOW, with the set terminal S being in High state. When both terminals S and R are HIGH, the value of the output O remains unchanged. The state of both terminals S and R being LOW is inhibited. The SR latch may also be termed as 'SR flip-flop'.

The latch circuit 130O which has a set terminal S supplied with a one-shot pulse CLKO from the one-shot pulse generating circuit 121O is also a NAND SR latch of the same configuration as the latch circuit 130E. An output O (INRO) of the latch circuit 130O is supplied to the second synthesis circuit 100R.

The latch circuit 130F includes an SR latch circuit 131E for Even and an SR latch circuit 131O for Odd. These two SR latch circuits are of the same configuration. The set terminals of these SR latch circuits 131E and 131O receive one-shot pulses CLKE and CLKO from the one-shot pulse generating circuit 120F, respectively.

In the present embodiment, the output OUT (NR) of the second synthesis circuit 100R rises from LOW to HIGH in response to rise from LOW to HIGH of the clock signal DLCLKA. Since the SR latch circuits 130E and 130O need to be reset at a time point when the output OUT (NR) goes from LOW to HIGH, the output OUT (NR) of the second synthesis circuit 100R, inverted by the inverter 132, is used as a reset signal for each of the SR latch circuits 130E and 130O.

The Fall side latch circuit 130F is configured similarly to the Rise side latch circuit 130R. Since the SR latch circuits 131E, 131O in the latch circuit 130F need to be reset at a time point when the output OUT (NF) of the second synthesis circuit 100F goes HIGH from LOW, the output OUT (NF) of the second synthesis circuit 100F, inverted by the inverter 132, is used as a reset signal for each of the Even SR latch circuit 131E and the Odd latch circuit 131O in the latch circuit 130F The Rise side second synthesis circuit 100R, responsive to rising edges of the Even signal INRE and the Odd signal INRO from the SR latch 130R, generate a signal corresponding to synthesis of a delay difference thereof in accordance with a synthesis ratio X:(1−X), where $0 \leq X \leq 1$. This synthesis ratio X:(1−X) is controlled by the bias signals BIASRE/O and BIASFE/O. A Rise signal is generated from an output terminal OUT (NR). The SR latch 130R is reset in response to a HIGH of the output (NR) of the second synthesis circuit 100R to set INRE and INRO to LOW. In the present embodiment, the delay signals OUTRE_B and OUTRO_B, output from the first variable delay circuit 20, are supplied to the second synthesis circuit 100R. This second synthesis circuit 100R performs control to make a path which turns off an internal node (i.e., causes it to go non-conductive) in a case where at least one of the signals OUTRE_B and OUTRO_B is LOW. The second synthesis circuit 100R synthesizes two input signals at a prescribed ratio. The second synthesis circuit 100R by itself is also called an interpolation circuit or interpolator, and performs the interpolation function of the second variable delay circuit (interpolator) 10R of FIG. 2.

The Fall side second synthesis circuit 100F receives bias voltages BIASFE and BIASFO that set the delay synthesis ratio. The second synthesis circuit 100F is responsive to the rising edges of the Even signal INFE and the Odd signal INFO from the SR latch 130F to generate a signal which is the synthesis of the delay difference to supply a rise signal at the output terminal OUT (NF). The SR latch 130F is reset by the HIGH from the output terminal OUT (NF) of the second synthesis circuit 100F to set INFE and INFO to LOW. In the present embodiment, the delay signals OUTFE_B, OUTFO_B, output from the first variable delay circuit 20, are delivered to the second synthesis circuit 100F, which second synthesis circuit exercises control to turn the path charging an internal node off when at least one of OUTFE_B and OUTFO_B is LOW. It is observed that the second synthesis circuit 100F synthesizes two input signals at a prescribed ratio. The second synthesis circuit 100F by itself is also called an interpolation circuit or interpolator, and takes charge of the interpolation function of the second variable delay circuit (interpolator) 10F of FIG. 2.

The inversion output by the variable delay circuit of FIG. 3, one-shot pulse generation in the circuit configuration of, for example, an SR latch, may, of course, be changed as necessary. For example, a one-shot LOW pulse is generated in response to the fall of the input signal to the one-shot pulse generating circuit. However, the present invention is not to be limited to this configuration.

FIG. 4 shows an example configuration of the second synthesis circuit 100R. Meanwhile, the Fall side second synthesis circuit 100F of FIG. 3 is of the same configuration as that of the Rise side second synthesis circuit 100R.

Referring to FIG. 4, the second synthesis circuit 100R includes the following components:

(a) PMOS transistors 109 and 110 that have sources connected in common to a power supply VDD, have drains connected in common to a node NR_B and have gates connected respectively to WEAKPREB and PRSTB;

(b) NMOS transistors 107 and 108 that have drains connected to the node NR_B and receives the bias voltages BIASRE and BIASRO at respective gates;

(c) PMOS transistors 105 and 106 that have sources connected in common to the power supply VDD, have gates connected in common to an output WEAKPREB of a NAND 114 and having drains connected respectively to drain nodes NE and NO of the NMOS transistors 107 and 108;

(d) NMOS transistors 101 and 102 that have drains connected in common to the nodes NE and NO and have gates connected to the outputs INRE and INRO of the latch circuit 130R; and (e) NMOS transistors 103 and 104 that have drains connected to the sources of the NMOS transistors 101 and 102, have gates connected together and connected to the output PRSTB of the inverter 116 and have sources connected in common to the power supply VSS. The second synthesis circuit 100R further includes (f) an inverter 115 (inverting output buffer) that has an input connected to the node NR_B to output an inverted signal at an output terminal OUTR;

(g) an inverter 116 that receives the output (NR) of the inverter 115 as input to output an inverted signal as a PRSTB signal;

(h) a NAND circuit 111 that receives outputs OUTRE_B and OUTRO_B of the first variable delay circuit 21R;

(i) an inverter 112 that receives an output of the NAND circuit 111;

(j) a NAND circuit 113 that has a first input supplied with the PRSTB signal and has a second input supplied with the output of the NAND 114, and a NAND circuit 114 that has a first input supplied with the output signal of the inverter 112 and has a second input supplied with the output of the NAND 113. The NANDs 113 and 114 composes a SR latch.

The operation of the second synthesis circuit 100R will now be described. When the node NR_B is precharged to a HIGH level, the signal PRSTB is HIGH to make the PMOS transistor 110 off (non-conductive). The output of the NAND 114 is set to HIGH when the output of the inverter 112 is LOW. It is when the output of the NAND 111 is HIGH and hence one or both of OUTRE_B and OUTRO_B is LOW that the output of the inverter 112 is brought LOW. That is, referring to FIG. 2, when the input clock signal DLCLKA rises from LOW to HIGH, that is, when at least one of OUTRE and OUTRO is HIGH (and hence at least one or both of OUTRE_B and OUTRO_B is LOW) that the PMOS transistors 109, 105, and 106 are made off (non-conductive) to stop the charging of the nodes NR_B, NE and NO.

When the node NR_B is LOW with PRSTB LOW, the PMOS transistor 110 is turned on (made conductive), while the NMOS transistors 103 and 104 are turned off (made non-conductive) to disconnect the discharging path between the node NR_B and VSS (ground) to charge the node NR_B to the power supply potential VDD. When PRSTB is brought LOW with the output of the inverter 112 HIGH, the output WEAKPREB of the NAND 114 is reset to LOW. The PMOS transistors 109, 105 and 106 are turned on (conductive) so that the nodes NR_B, NE and NO are charged to the power supply voltage VDD. The nodes NE and NO are precharged by the PMOS transistors 105 and 106 in parallel with the node NR_B to provide for a shorter pre-charging time to assure the operation of the second synthesis circuit.

When the node NR_B is charged to the power supply voltage VDD, the output of the inverter 115, which receives as an input the voltage of the node NR_B, is brought LOW and PRSTB, which is the output of the inverter 116 is brought HIGH to make the PMOS transistor 110 off (non-conductive). This causes the charging of the node NR_B by the PMOS transistor 110 to come to a close. When PRSTB is HIGH, the NMOS transistors 103 and 104 are turned on (made conductive) to operate as current sources. However, when the INRE and INRO are both LOW, the NMOS transistors 101 and 102 are turned off (made non-conductive). With the output of the inverter 112 HIGH, WEAKPREB which is the output of NAND 114 is kept LOW, even when PRSTB has changed from LOW to HIGH. Thus, the PMOS transistors 109, 105 and 106 are kept on (remain conductive).

When the clock signal DLCLKA is LOW, OUTRE_B and OUTRO_B are HIGH, so that the output of the NAND 111 is set to LOW and the output of the inverter 112 is HIGH. If at least one of OUTRE_B and OUTRO_B transitions from HIGH to LOW, that is, at the rise time of the clock signal DLCLKA, the output of the NAND 111 goes HIGH, while the output WEAKPREB of the NAND 114 is set to HIGH to make the PMOS transistors 109, 105 and 106 off (made non-conductive). If, in this state, INRE and INRO transitions from LOW to HIGH, the NMOS transistor 101 is turned on (made conductive) during the HIGH period of INRE. This causes charge on the node NR_B to be discharged towards the VSS side by a current (drain-to-source current) of the NMOS transistor 107 which is controlled by BIASRE. During the HIGH period of INRO, which goes HIGH with a delay from the transition of INRE from LOW to HIGH, the NMOS transistor 102 is turned on (made conductive) to discharge the charge on the node NR_B to the VSS by a current (drain-to-source current) of the NMOS transistor 108 which is controlled by BIASRO.

When INRE and INRO are both HIGH, charge on the node NR_B is discharged via both the transistors 101 and 102. When the voltage at the node NR_B falls to below the logical threshold value of the inverter 115, the output node NR of the inverter 115 rises from LOW to HIGH. The output PRSTB of the inverter 116 is brought LOW to make the NMOS transistors 103 and 104 turn off (made non-conductive) to disconnect the discharge path of the node NR_B to VSS. The charging of the node NR_B by the PMOS transistor 110 is started. The output WEAKPREB of the NAND 114 then is brought LOW. This turns the PMOS transistor 109 on (makes it conductive) to charge the node NR_B.

The ratio of delay synthesis of INRE and INRO (ratio of internal division) is set to X:(1−X), where $0 \leq X \leq 1$. The current values through the NMOS transistors 107 and 108, whose gates receive bias voltages BIASRE and BIASRO, respectively, are set so as to be X*I and (1−X)*I, respectively. The node NR_B, precharged to the power supply voltage VDD, is discharged by HIGH pulses of the rising edges of the two signals INRE and INRO with a delay difference (ΔT). It is observed that charges Q stored in the node NR_B are given by Q=C*VDD, where C is the capacitance of the node NR_B. During the delay time ΔT since the rise of the Even input signal INRE to HIGH until the rise of the Odd input signal INRO to HIGH, the NMOS transistor 101 is turned on (made conductive) to discharge the node NR_B with the current value of X*I. The charges Q' on the node NR_B are equal to C*VDD−ΔT*X*I. When the second signal INRO is brought HIGH, the NMOS transistor 102 is turned on (made conductive) to discharge the charges on the node NR_B with the current value of X*I+(1−X)*I=I in conjunction with the NMOS transistor 101. It is now assumed that the logical threshold value of the inverter 115 that has an input connected to the node NR_B is VDD/2, and the voltage falls below VDD/2 after delay time T as from the rise edge of the Odd input signal INRO. Then, from $$C*VDD-X*I*\Delta T-I*T=C*VDD/2,$$

we obtain:

$$T=(C*VDD)/(2*I)-X*\Delta T.$$

Thus, the propagation delay from the rise of the Even input signal INRE to the rise of the output terminal NR, excluding the propagation delay of the inverter 115, is given by $$\Delta T+T=(C*VDD)/(2*I)+(1-X)*\Delta T \quad (1)$$

In the above equation (1), (C*VDD)/(2*I) is the propagation delay proper to the second synthesis circuit.

If, in the equation (1), X=1, that is, the internal division ratio of the delay difference of the Even input signal INRE and the Odd input signal INRO is 100%:0%, the delay time is given by $$\Delta T+T=(C*VDD)/(2*I).$$

This propagation delay time ΔT+T is the minimum.

If, in the equation (1), X=0, that is, the internal division ratio of the delay difference of the Even input signal INRE and the Odd input signal INRO is 0%:100%, the delay time is given by $$\Delta T+T=(C*VDD)/(2*I)+\Delta T.$$

This propagation delay time ΔT+T is the maximum.

If, in the equation (1), 0<X<1, propagation delay time ΔT+T takes an intermediate value between the minimum and maximum values.

It should be noted that in FIG. 4, the pulse width of a signal output from the output terminal OUT is also adjusted by setting the bias voltages BIASRE and BIASRO.

Figure 5:
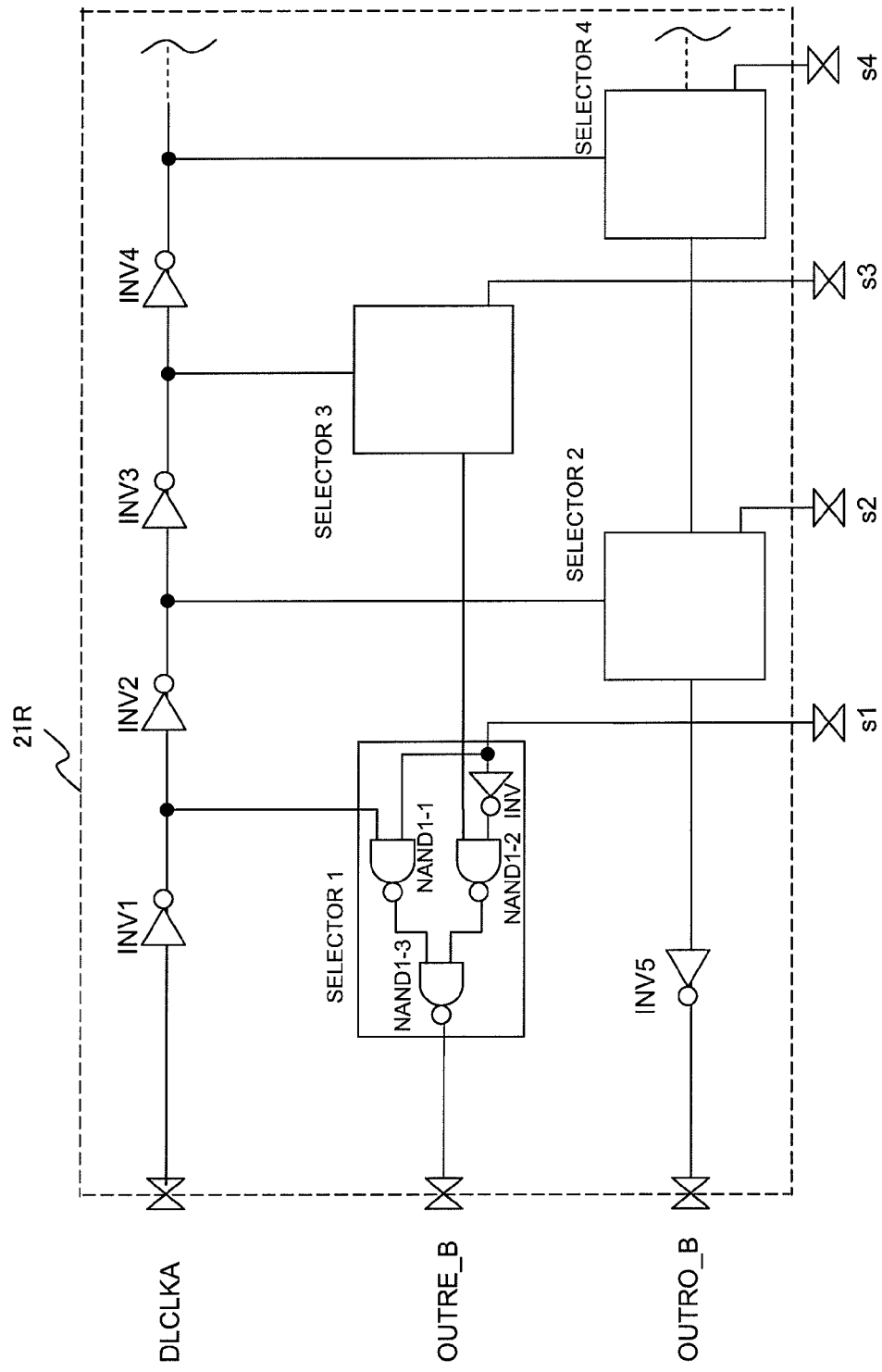
FIG. 5 is a circuit diagram showing a configuration of the first variable delay circuit (delay line) of an embodiment of the present invention.

FIG. 5 shows the configuration of the variable delay circuit 21R in the first variable delay circuit 20 of FIG. 3. Meanwhile, the variable delay circuit 21F of FIG. 3 is similar in configuration to the variable delay circuit 21R.

Referring to FIG. 5, in the variable delay circuit 21R as shown in FIG. 3, an output of the inverter INV1 that receives the clock signal DLCLKA is connected to an input of the next stage inverter INV2 and also connected to a first input of a selector 1. The selector 1 has a second input connected to an output of the selector 3 of a preceding stage. An output of the selector 1 is OUTRE_B. The selector 1 selects one of the first and second inputs in accordance with a value of a selection control signal s1 from the phase adjustment circuit 80R (FIG. 2). The selector 1 includes a NAND 1-1, an inverter INV, a NAND 1-2 and a NAND 1-3. The NAND 1-1 receives the selection control signal s1 supplied from the phase adjustment circuit 80R and an output of the inverter INV1. The inverter INV inverts the selection control signal s1 supplied from the phase adjustment circuit 80R. The NAND 1-2 receives an output of the inverter INV and an output of the selector 3, and the NAND 1-3 receives outputs of these two NANDs 1-1 and 1-2. The internal configuration of each of the other selectors is the same as that of the selector 1.

An output of the inverter INV2 is connected to an input of the next stage inverter INV3 and also connected to a first input of the selector 2. A second input of the selector 2 is connected to an output of the selector 4 of the preceding stage. An output of the selector 2 is connected via an inverter INV5 to the output OUTRO_B. The selector 2 selects one of the first and second inputs in accordance with a value of a selection control signal s2 supplied from the phase adjustment circuit 80R.

An output of the inverter INV3 is connected to an input of the next stage inverter INV4 and also connected to a first input of the selector 3. A second input of the selector 3 is connected to an output of a fifth selector, not shown. An output of the selector 3 is connected to a second input of the selector 1. The selector 3 selects one of the first and second inputs in accordance with a value of a selection control signal s3 supplied from the phase adjustment circuit 80R.

An output of the inverter INV4 is connected to an input of a next stage inverter, not shown and also connected to a first input of the selector 4. A second input of the selector 4 is connected to an output of a sixth selector, not shown. An output of the selector 4 is connected to a second input of the selector 2. The selector 4 selects one of the first and second inputs in accordance with a value of a selection control signal s4 supplied from the phase adjustment circuit 80R. A configuration for Even and Odd, similar to that described above, is repeated for the inverter string in its entirety (INV1, INV2, INV3, INV4 and so forth).

When the selection control signal s1 is HIGH, an output of the inverter INV of the selector 1 is brought LOW, and an output of the NAND 1-2 is brought HIGH. The NAND 1-1 and the NAND 1-3 operate as a dual stage inverter that inverts and outputs the first inputs. When the selection control signal s1 is HIGH, the selector 1 selects the output of the inverter INV1, so that the selector operates as a delay circuit of two stages NANDs, more specifically, as a delay circuit of three stages of inverters made up of INV1 and two NAND stages.

On the other hand, if the selection control signal s1 is LOW, the output of the inverter INV is brought HIGH and the output of the NAND 1-1 is brought HIGH. The NAND 1-2 and the NAND 1-3 operate as two stage of inverters, each of which inverts a signal at the second input (output of the selector 3) to propagate the thusly inverted signal of the second input.

When the selection control signal s2 is HIGH, the selector 2 selects an output of the inverter INV2 so as to operate as a delay circuit of two stages of NANDs. That is, the variable delay circuit operates as a delay circuit of a five stages of inverters made up of INV1, INV2, two stages of NANDs and INV5. There is a time difference of two stages of inverters (unit delay circuit) between the edges of the Even delay signal OUTRE_B and the Odd delay signal OUTRO_B that are output when the selection control signals s1 and s2 are HIGH.

When the selection control signal s2 is LOW, the selector 2 operates as a delay circuit of two stages of inverters, each of which inverts a signal at the second input (output of the selector 4) to propagate the so inverted signal of the second input.

When the selection control signal s3 is HIGH, the selector 3 selects the output of INV3 and operates as a delay circuit of two stages of NANDs. When the selection control signal s3 is HIGH and the selection control signal s1 is LOW, the variable delay circuit operates as a delay circuit of seven stages of inverters made up of INV1, INV2, INV3, two stages of NANDs (selector 3) and two stages of NANDs (selector 1).

When the selection control signal s4 is HIGH, the selector 4 selects the output of INV4 and operates as a delay circuit of two stages of NANDs. When the selection control signal s4 is HIGH and the selection control signal s2 is LOW, the variable delay circuit operates as a delay circuit of a nine stages including of INV1, INV2, INV3, INV4, two stages of NAND (selector 4), two stages of NANDs (selector 2) and INV5.

There is a time difference of two stages of inverters (unit delay circuit) between the edges of the Even delay signal OUTRE_B and the Odd delay signal OUTRO_B that are output when the selection control signals s3 and s4 are HIGH.

Thus, the variable delay circuit 21R determines the Even delay output and the Odd delay output by the selection control signal supplied from the phase adjustment circuit 80R of FIG. 2. In FIG. 5, outputs of the variable delay circuit 21R are denoted as OUTRE_B and OUTRO_B to indicate that these signals fall from HIGH to LOW with the rise from LOW to HIGH of the clock input DLCLKA.

Figure 6:
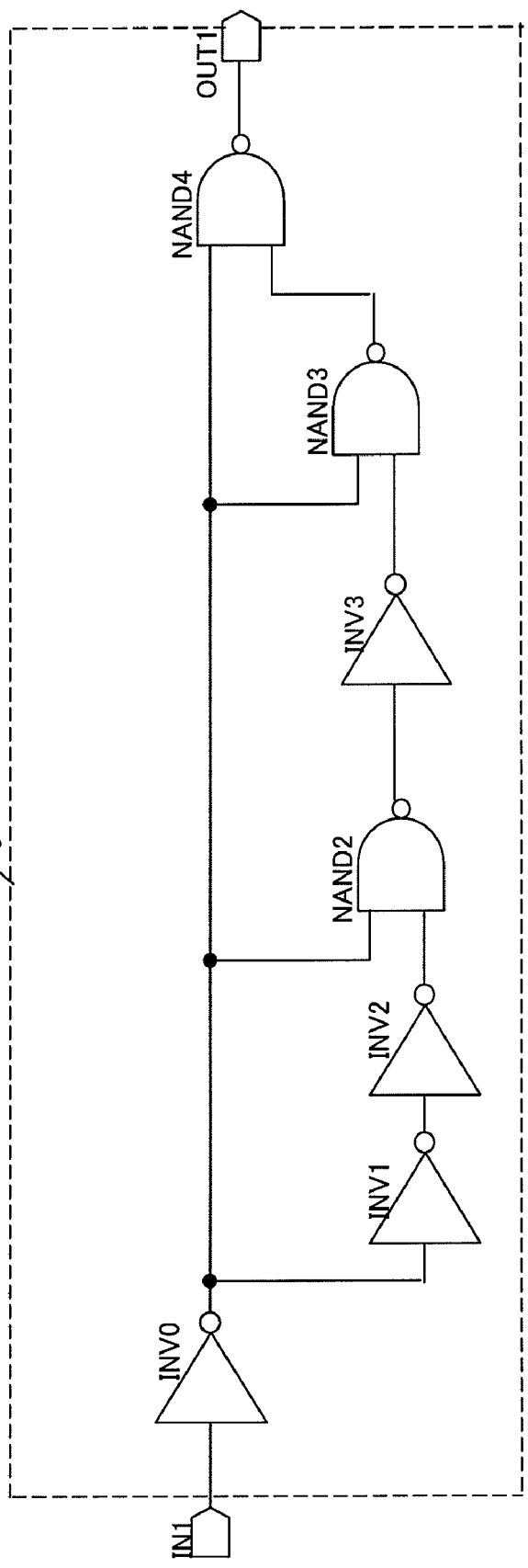
FIG. 6 is a circuit diagram showing a configuration of a one-shot pulse generating circuit of an embodiment of the present invention.

FIG. 6 shows an example configuration of a one-shot pulse generating circuit 121E of FIG. 3. This one-shot pulse generating circuit, responsive to the fall edge of an input IN1, produces at an output OUT1 a LOW pulse of a prescribed pulse width. The pulse width of the one shot pulse is determined by a delay circuit. This one-shot pulse generating circuit includes an inverter INV0 that receives a signal at an input IN1, and a delay circuit (including INV1, INV2, NAND2, INV3 and NAND3) that receive an output signal of the inverter INV0 to output an inverted signal. The one-shot pulse generating circuit also includes a NAND4 that receives an output of the delay circuit (output of NAND3) and an output of an inverter INV0. NAND2, NAND3 and NAND4 correspond respectively to fourth, fifth and sixth logic circuits in claims.

An output of the inverter INV0 is brought HIGH responsive to transition from HIGH to LOW of the input IN1. NAND2 and NAND3, composing the delay circuit, operate as inverters so that the entire delay circuit operates as a five stages of inverters. NAND4 outputs a LOW pulse of a pulse width corresponding to the delay time of the five stages of inverters from the time of transition from LOW to HIGH of the inverter INV0.

The one-shot pulse width of the one-shot pulse generating circuit may be adjusted in association with the operating frequency. For example, assuming that an inverting delay circuit, represented by the inverter INV3, includes three stages of inverters, the two stages of inverters may be removed from the signal path by switching so that the one-shot pulse generating circuit is composed of one stage inverter. This switching may be by connection switching of an interconnect layer switch (metal switch) at the time of manufacture. The reset time of the one-shot delay may also be adjusted in relation to the frequency. The operation of the second synthesis circuit may be assured by-passing a reset path of the delay for the high frequency. As shown in FIG. 6, an output of the inverter INV0 is directly connected to an input of NAND2 and to an input of NAND3 so that NAND2 and NAND3 are directly reset to HIGH, based on the LOW output of the inverter INV0. That is, NAND2 and NAND3 are able to be reset without waiting for a signal propagating through a reset path preceding NAND2 and NAND3 in the delay circuit.

FIG. 7 shows a configuration of the first and second latch circuits and the second synthesis circuit of an embodiment of the present invention. Referring to FIG. 7, the configuration is such that the latch circuits 130E, 130O of FIG. 3 are built into the second synthesis circuit 100R explained above with reference to FIGS. 3 and 4. Referring further to FIG. 7, the NANDs 133 and 134 are equivalent to the latch 130E, and the NANDs 135 and 136 are equivalent to the latch 130O. The configuration of FIG. 7 also includes an inverter 137 (receiving circuit), that has an input connected to the terminal OUTRE_B, and an inverter 138 that receives an output INRE1 of the inverter 137. An output INRE 2 of the inverter 138 is supplied to the NAND 133, and PRSTB is supplied to the NAND 134. Outputs of the NANDs 133 and 134 are cross-coupled to the inputs of the NANDs 134 and 133. The configuration also includes an inverter 139 (receiving circuit) that has an input connected to the terminal OUTRO_B, and an inverter 140 that receives an output INRO1 of the inverter 139. An output INRO2 of the inverter 140 is supplied to the NAND 135, and PRSTB is supplied to the NAND 136. The outputs of the NANDs 135 and 136 are cross-coupled to inputs of the NANDs 136 and 135. In FIG. 7, outputs of the one-shot pulse generating circuits (120R in FIG. 3) are supplied as OUTRE_B and OUTRO_B to the inverters 137 and 139.

In FIG. 7, the interpolator, in which NR_B is precharged to a power supply voltage and discharged via NMOS transistors 101 and 102 that receive outputs of latch outputs INRE3 and INRO3, has been described. However, the present invention is not limited to this configuration. For example, the interpolator may be arranged so that the node NR_B is set to the VSS potential and the outputs of the latch outputs INRE3 and INRO3 are supplied to PMOS transistors for charging to the power supply voltage VDD. In this case, the transistor polarity is reversed, while each SR latch is changed in logic so that the SR latch is set by a HIGH input at the set terminal S and reset by a HIGH input at the reset terminal R. The precharging transistors 109, 110, 105 and 106 are formed by NMOS transistors whose sources are grounded and whose drains are connected to respective nodes. The transistors 101 to 104, 107 and 108 are formed by PMOS transistors. When the node NR_B is higher than the logic threshold value of the inverter 115, a LOW potential is output, and hence the output of the inverter 116 is brought HIGH. An SR latch (113, 114), which is reset in response to HIGH of the inverter 116, is formed by two cross-coupled NOR gates. The NAND 111 and the inverter 112 of FIG. 7 are replaced by ANDs. The NANDs 133 to 136 are also replaced by NORs, and the inverters 137 and 139 are deleted.

Figure 8:
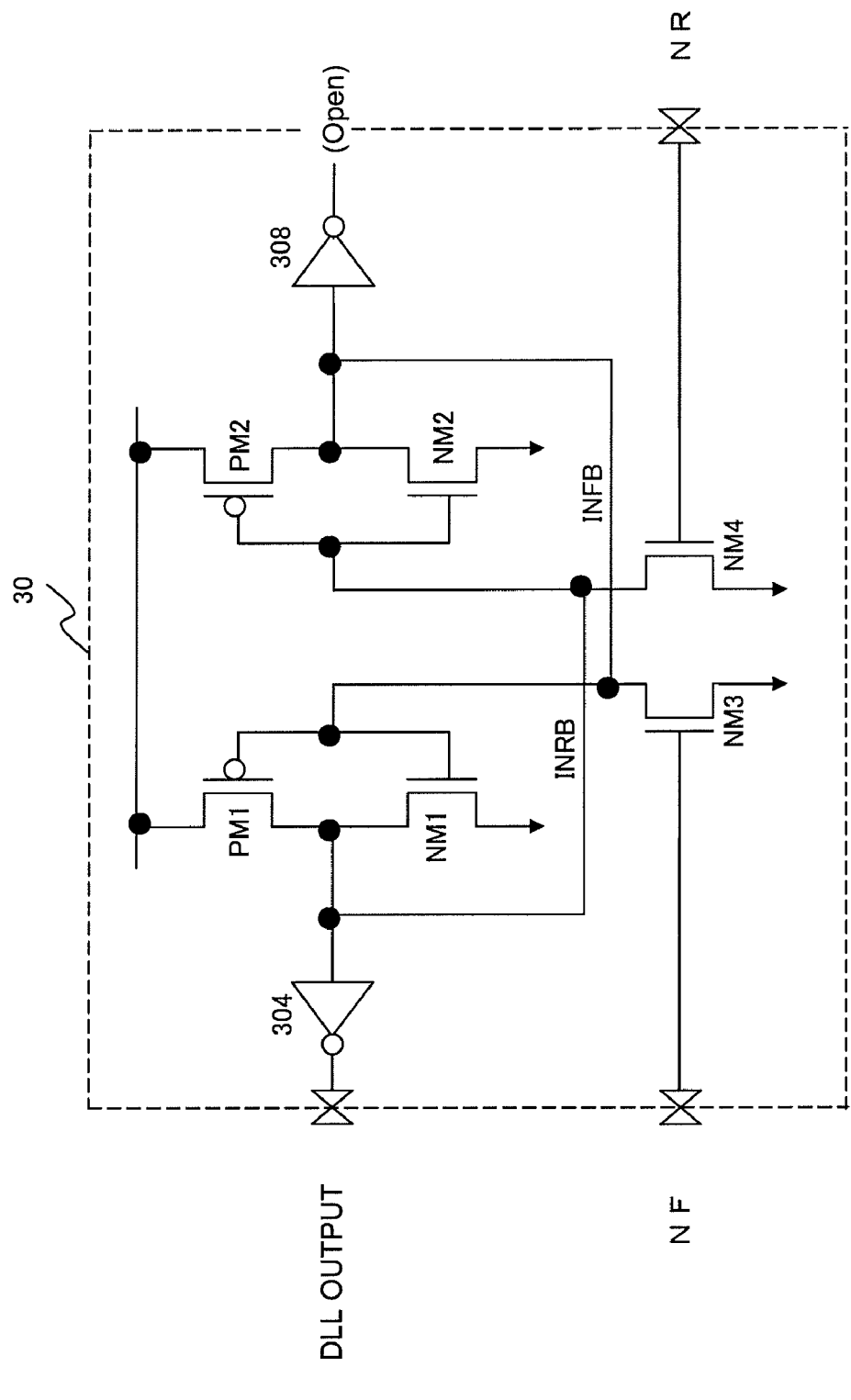
FIG. 8 is a circuit diagram showing a configuration of a first synthesis circuit (synthesizer) of an embodiment of the present invention.

FIG. 8 shows an example configuration of a first synthesis circuit (synthesizer) 30 of FIG. 2. The synthesizer 30 sets a DLL output to HIGH, responsive to a HIGH level of an output NR of the interpolator 10R, while setting the DLL output to LOW, responsive to a HIGH level of an output NF of the interpolator 10F.

Referring to FIG. 8, the first synthesis circuit (synthesizer) 30 includes:

an NMOS transistor NM4 that has a source connected to the power supply VSS, has a gate connected to NR and that has a drain connected to a node INRB, an NMOS transistor NM3 that has a source grounded, has a gate connected to NF and has a drain connected to the node INFB, a CMOS inverter (PM2, NM2) that has an input connected to the node INRB and that has an output connected to the node INFB, a CMOS inverter (PM1, NM1) that has an input connected to the node INFB and that has an output connected to the node INRB, an inverter 304 that has an input connected to the node INRB and an inverter 308 that has an input connected to the node INFB and that has an output open. The CMOS inverters (PM1, NM1) and (PM2, NM2) have inputs and outputs cross-connected to constitute a flip-flop. More specifically, the output of the CMOS inverters (PM1, NM1) is connected to the input of the CMOS inverters (PM2, NM2) whose output is connected to the input of the CMOS inverters (PM1, NM1).

The operation of the first synthesis circuit (synthesizer) 30 shown in FIG. 8 will now be described. When the input NR is brought HIGH, the NMOS transistor NM4 is turned on (conductive), so that the node INRB goes LOW. The node INFB is set to HIGH by the CMOS inverter (PM2, NM2) and the node INRB is set to LOW by the CMOS inverter (PM1, NM1), so that a HIGH is output as the DLL output from the inverter 304.

When the input NR is brought LOW, the NMOS transistor NM4 is turned off (non-conductive). However, nodes INRB and INFB are kept LOW and HIGH, respectively, by the CMOS inverter (PM1, NM1) and the CMOS inverter (PM2, NM2) operating as a flip-flop. Thus, a High level keeps on to be output as the DLL output from the inverter 304.

When next the input NF is brought HIGH, the NMOS transistor NM3 is turned on (made conductive) so that the node INFB is brought LOW. The node INRB is set to HIGH by the CMOS inverter (PM1, NM1), while the node INFB is set to LOW by the CMOS inverter (PM2, NM2). A LOW level is output as a DLL output from the inverter 304. When next NF is brought LOW, nodes INRB and INFB are kept HIGH and LOW, respectively, by the CMOS inverter (PM1, NM1) and the CMOS inverter (PM2, NM2) operating as a flip-flop. Thus, a LOW level keeps on to be output as the DLL output from the inverter 304. The CMOS inverter includes a PMOS transistor and an NMOS transistor connected in series with each other across the power supply VDD and the power supply VSS. The PMOS transistor and NMOS transistor composing the CMOS inverter have gates connected in common and connected to an input, while having drains connected in common and connected to an output.

FIG. 9 shows examples of operating waveforms of the second synthesis circuit (Rise side) explained with reference to FIG. 7. Specifically, (a) denotes a waveform of external clocks CK and CKB, (b) waveforms of INRE1 and INRO1, (c) waveforms of INRE2 and INRO2, (d) waveform of INRE3 and INRO3, (e) a waveform of NR_B and (f) waveforms of PRSTB and WEAKPREB. In addition, (g) to (k) denote waveforms of INRE1, INRO1, INRE2, INRO2, INRE3, INRO3, NR_B, PRSTB and WEAKPREB in the second synthesis circuit on the Fall side, which has the same configuration as that of FIG. 7, and (1) denotes the waveform of the DLL output.

OUTRE_B and OUTRO_B go from HIGH to LOW in response to the rise of the external clock CK having a pulse width of tCH. A one-shot pulse (LOW pulse) is generated by the one-shot pulse generating circuit (120R in FIG. 2).

INRE1 and INRO1 are HIGH pulses inverted by the inverters 137 and 139 from the one-shot pulse (LOW pulse). INRE1 rises temporally before INRO1 (see (b)).

INRE2 and INRO2 are signals obtained by inverting INRE1 and INRO1 by the inverters 138 and 140, respectively. INRE3 and INRO3, which are outputs of an SR latch (NANDs 133 and 134) and an SR latch (NANDs 135 and 136), respectively, are set to HIGH in response to the LOWs of INRE2 and INRO2, respectively.

When INRE3 and INRO3 go HIGH, the NMOS transistors 101 and 102 are turned on (made conductive). The node NR_B, precharged to the power supply voltage VDD, is discharged in accordance with the source-to-drain currents of the transistors 107 and 108, that are biased by BIASRE and BIASRO, respectively (see (e)).

When the voltage at the node NR_B falls below the logical threshold value of the inverter 115, node NR transitions from LOW to HIGH. The output PRSTB of the inverter 116 then goes LOW. The SR latch including NANDs 133 and 134, and the SR latch including NANDs 135 and 136, are reset responsive to a LOW level of PRSTB. INRE3 and INRO3 are brought LOW from HIGH to LOW so that the NMOS transistors 101 and 102 are turned off (made non-conductive). Responsive to a LOW level of PRSTB, the PMOS transistor 110 is turned on (made conductive) and the NMOS transistors 103 and 104 are turned off (made non-conductive) so that the node NR_B is precharged to the power supply voltage. With the PRSTB being LOW, the SR latch including NANDs 113 and 114 is reset so that WEAKPREB is brought LOW to precharge the nodes NR_B, NE and NO by the PMOS transistors 109, 105 and 106, respectively.

A signal NR obtained by inverting the Rise side NR_B by the inverter 115, and a signal NF obtained by inverting the Fall side NR_B by the inverter 115, are supplied to the synthesizer 30 (see FIG. 2) to deliver a DLL output (see (1)).

In a case the setting of the bias voltages BIASRE and BIASRO in FIG. 7 corresponds to INRE3=100% and INRO3=0%, node NR_B is discharged via the path of the transistor 107. The fall waveform of the node NR_B is generated with the Even INRE3 of 100%. This condition is such that the discharge operation of the node NR_B is started at a latest time with respect to the operation in one cycle. It is noted that, if a HIGH pulse width of the external clock CK (tCH width) is short, the HIGH period of INRE3 is extremely short and hence the time for discharging the node NR_B is short, indicating that the condition is most adverse. Hence, this condition represents the worst condition (i.e., worst case) under which a timing margin for discharging the node NR_B and a timing margin for precharging the node NR_B until the operation of the next cycle are fully used, i.e., depleted. If the clock cycle is short, the recharging time of the node NR_B after discharge thereof is short and hence the condition is most adverse or worst case.

In the present embodiment, latch circuit 130R (130F) is provided ahead of the second synthesis circuit 100R (100F) and the outputs OUTRE_B and OUTRO_B (OUTFE_B and OUTFO_B) of the first variable delay circuit 20 are transferred to the set terminal S of the latch circuits 130R (130F). The latch circuit 130R (130F), when set, provides a HIGH level output for a prescribed time (that is, until the latch circuit is reset), even if the pulse width tCH of the clock CK is short. When the output of the latch circuits 130R (130F) is HIGH, the node NR_B in the second synthesis circuits 100R (100F) is discharged. Latch circuits 130R (130F) is reset responsive to the falling of the node NR_B in the second synthesis circuit 100R (100F). Subsequently, node NR_B in the second synthesis circuit 100R (100F) is precharged. Hence, the operational margin of the second synthesis circuit 100R (100F) may be secured even when the operation is to start at a late time.

As a comparative example, such a case where the above-described SR latch circuit is omitted is now described with reference to FIG. 10A. Let us consider a configuration in which the SR latch (133, 134) and the SR latch (135, 136) of FIG. 7 are omitted with and signals INRE1 and INRO1 obtained by inverting OUTRE_B and OUTRO_B by the inverters 137 and 139, respectively, are supplied to the gates of the NMOS transistors 101 and 102. That is, INRE1 and INRO1 of FIG. 7 (signals inverted from the OUTRE_B and OUTRO_B) are supplied to the gates of the NMOS transistor 101 and 102. The Even signal INRE1 rises first, followed by the Odd signal INRO1. If the tCH width of the external clock CK is short, that is, the duty cycle is short, during a LOW period of the external clock CK after the end of the HIGH period of the external clock CK, a reverse phase edge of the output needs to be generated in the second synthesis circuit. The operation of the second synthesis circuit comes to a close such that the discharge time of the node NR_B in the second synthesis circuit becomes extremely short. The node NR_B cannot be discharged sufficiently such that malfunctions of the second synthesis circuit are liable to be produced (the second synthesis circuit may not operate properly).

In the second synthesis circuit according to the present example, the signals INRE3 and INRO3, which are outputs of the SR latch (133, 134) and the SR latch (135, 136) latching OUTRE_B and OUTRO_B, respectively, are supplied to the gates of the NMOS transistors 101 and 102 in the second synthesis circuit. PRSTB releases the latch of INRE3 and INRO3 by of the SR latch (133, 134) and the SR latch (135, 136). It is after the second synthesis circuit outputs a HIGH level to NR that PRSTB is set to LOW, and hence re-charging malfunctions can be avoided. When PRSTB is LOW, the SR latch (133, 134) is reset, as a result of which the INRE3 in a HIGH state is reset to LOW.

When PRSTB is LOW, the SR latch (113, 114) is also reset and WEAKPREB is reset to LOW. WEAKPREB is used to hold the reset state of the node NR_B (charging) in a case where the external clock CK is operating at a low frequency.

Regarding the node NR_B, a feedback control is performed such that the node NR_B, precharged to a prescribed voltage, is discharged by the transistors 109 and 110 and falls to a LOW potential as a result of discharging and then, the node NR_B is recharged. Hence, the voltage waveform of the node NR_B is a pulsed waveform of a prescribed time duration. Thus, if the external clock CK is a low frequency, that is, has a longer period, it is necessary to maintain the resetting operation (charging operation) of the node NR_B. The WEAKPREB signal, which is set to LOW based on the LOW of PRSTB, is brought HIGH by the output signals OUTRE_B and OUTRO_B of the first variable delay circuit 20. If one or both of the OUTRE_B and OUTRO_B is LOW, the output of the NAND 111 goes HIGH, while the output of the inverter 112 goes LOW. The output WEAKPREB of the NAND 114 goes HIGH so that the precharging of the node NR_B by the transistor 109 ceases. At a point in time when OUTRE_B and OUTRO_B are both LOW, it is necessary to proceed to arranging for generation of a delayed waveform for the next clock cycle. It is thus sufficient to maintain the operation of charging the node NR_B until that time. This allows for suppressing the occurrence of the floating state of the node NR_B, even if the external clock signal CK is a low frequency, that is, of a longer cycle or period.

It is again necessary to take measures in connection with operating margins for the signal WEAKPREB. Assume that the external clock signal CK has a long HIGH pulse width (long tCH width), that is, a long duty cycle, i.e., the fall of INRE3/INRO3 is sufficiently delayed or retarded, as shown in FIG. 11A (see broken lines INRE/O 3 in FIG. 11A). In such a case, it is possible to sufficiently discharge the node NR_B. However, since there are a path of delay stages (NR_B→PRSTB→WEAPPREB) in the generation of the signal WEAKPREB, a start of charging of the transistor 109 by the WEAKPREB signal is delayed and may possibly lag behind the condition of OUTRE_B/OUTRO/B of the next cycle being LOW. In such case, the signal WEAKPREB being LOW cannot be generated, thus possibly giving rise to malfunctions and improper operation.

Thus, in the present example, the one-shot pulse generating circuit 120R is provided for the input signals OUTRE_B and OUTRO_B to generate one-shot pulses CLKE and CLKO in response to the falling edges of the OUTRE_B and OUTRO_B, respectively. The signal width of the one-shot pulses CLKE and CLKO is set at a fixed value without dependency upon the frequency (period being shorter) or the HIGH pulse width (tCH width) of the external clock CK. The one-shot pulse width (fixed value) may be set corresponding to an operation frequency of a product device, in a fabrication process thereof, for example, as explained with reference to FIG. 6.

With the present example, if the HIGH pulse width (tCH width) of the external clock signal CK is short (small duty), it may be extended by the SR latch, while if the tCH width is long (large duty), an extraneous signal width is eliminated by a one-shot pulse generating circuit.

As a result, the second variable delay circuit (interpolator), which is adapted for achieving phase adjustment with a resolution finer than the minimum delay time proper to the first variable delay circuit (absolute delay time value corresponding to two NAND stages) and for coping with a higher frequency may properly operate without dependency on the frequency or on the value of the pulse width tCH of an external clock CK.

The disclosures of the aforementioned Patent Documents are incorporated by reference herein in their entireties. The particular exemplary embodiments or examples may be modified or adjusted within the gamut of the entire disclosure of the present invention, inclusive of claims, based on the fundamental technical concept of the invention. Further, variegated combinations or selections of the elements disclosed herein may be made within the framework of the claims. That is, the present invention may encompass various modifications or corrections that may occur to those skilled in the art within the gamut of the entire disclosure of the present invention, inclusive of claim and the technical concept of the present invention.

In the above-described exemplary embodiment, the present invention has been applied to a memory. It should be noted that the present invention may also be applied to semiconductor devices in general including a DLL circuit, such as CPU, MCU or DSP. The present invention may also be applied to semiconductor devices, loaded with DLL circuits, included in SOC (system-on-chip), MCP (multi-chip package) of POP (package-on-package). The present invention also yields benefiting results in a system that uses the present device.

The transistors used are not limited to MOS transistors and may encompass various FETs (Field Effect Transistors), such as MIS (Metal-Insulator Semiconductor) transistors or TFTs (Thin-Film Transistors). The transistors may also be bipolar transistors. A PMOS transistor (P-channel MOS transistor) is typical of a first conductivity type transistor and an NMOS transistor (N-channel MOS transistor) is typical of a second conductivity type transistor).

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A DLL (delay locked loop) circuit comprising:
   a first variable delay circuit receiving an external signal to variably adjust a delay time of the external signal with a prescribed delay time unit, the first variable delay circuit producing a first set of first and second delay signals having different delay time values in association with a first transition of the external signal,
   the first variable delay circuit producing a second set of first and second delay signals having different delay time values in association with a second transition of the external signal;
   a pair of second variable delay circuits receiving the first set of the first and second delay signals and the second set of the first and second delay signals, respectively, the pair of the second variable delay circuits producing third and fourth delay signals, respectively, each delay time of the third and fourth delay signals being variably adjusted with finer resolution than the prescribed delay time unit in the first variable delay circuit; and
   a first synthesis circuit synthesizing the third and fourth delay signals from the pair of the second variable delay circuits to output a synthesized signal,
   the pair of second variable delay circuits each including:
   first and second one-shot pulse generating circuits, each of the first and second one-shot pulse generating circuits generating a one-shot pulse in response to a prescribed transition of each of the first and second delay signals of an associated set;
   first and second latch circuits receiving outputs of the first and second one-shot pulse generating circuit, respectively, the first and second latch circuits being set in response to the one-shot pulses supplied thereto from the first and second one-shot pulse generating circuit, respectively; and
   a second synthesis circuit receiving outputs of the first and second latch circuits, as first and second inputs, the second synthesis circuit synthesizing the first and second inputs at a prescribed ratio to output the synthesized signal,
   the first and second latch circuits being reset based on the output signal of the second synthesis circuit.

2. The DLL circuit according to claim 1, wherein the second synthesis circuit includes:
   a pre-reset circuit setting a predetermined node in the second synthesis circuit to a prescribed voltage; and
   first and second transistors controlled to be conductive or non-conductive based on the first and second inputs, respectively,
   the first and second transistors, when in conductive states, charging or discharging the node that is set to the prescribed voltages, to a voltage different from the prescribed voltage.

3. The DLL circuit according to claim 2, wherein, in the second synthesis circuit,
   the output of the second synthesis circuit is fed back and supplied to the pre-reset circuit, and wherein,
   when the node has been charged or discharged to a voltage different from the prescribed voltage and the output of the second synthesis circuit changes to a prescribed value, the pre-reset circuit sets the node to the prescribed voltage.

4. The DLL circuit according to claim 3, wherein the second synthesis circuit includes
   a latch circuit that is reset when the output of the second synthesis circuit is of the prescribed value,
   the latch circuit being set based on the result of a prescribed logical operation on the first and second delay signals;
   the pre-reset circuit including a circuit that sets the node to the prescribed voltage when the latch circuit is reset.

5. The DLL circuit according to claim 2, wherein the second synthesis circuit includes
   a delay control circuit, on a charging path or a discharging path of the node; the delay control circuit controlling the ratio of synthesis of the first and second inputs.

6. The DLL circuit according to claim 2, wherein the second synthesis circuit includes, between the node and a charging electrode or a discharging electrode,
   first and second delay control circuits that control current values of charging or discharging of the node to control the ratio of synthesis of the first and second inputs,
   the first and second delay control circuits being connected in series with the first and second transistors.

7. A DLL (delay locked loop) circuit comprising:
first and second one-shot pulse generating circuits, each generating a one-shot pulse responsive to transitions of each of first and second signals generated from a single signal, the first and second signals having a delay time difference;
first and second latch circuits being set in response to respective one-shot pulses; and
a synthesis circuit that receives outputs of the first and second latch circuits as first and second inputs, the synthesis circuit synthesizing the first and second inputs at a controlled ratio to output a resulting signal;
the first and second latch circuits being reset based on the output of the synthesis circuit.

8. The DLL circuit according to claim 7, wherein the synthesis circuit includes:
a pre-reset circuit connected between a first power supply and a predetermined node, the pre-reset circuit resetting the node to a prescribed voltage;
first and second transistors connected between the node and a second power supply,
the first and second transistors having control terminals connected to the first and second inputs, respectively,
the first and second transistors being turned on (conductive) and non-conductive, when the first and second latch circuits are set and reset, respectively;
first and second delay control circuits connected between the node and the second power supply in series with the first and second transistors, respectively,
the first and second delay control circuits causing current values corresponding to a ratio of the synthesis to flow;
a first logic circuit receiving the voltage of the node at an input thereof to supply an output signal to an output terminal of the synthesis circuit;
a second logic circuit receiving an output signal of the first logic circuit, the second logic circuit producing a signal for reset, when an output signal of the first logic circuit is of a prescribed value;
a third logic circuit receiving the first and second signals to output a signal for set, when at least one of the first and second signals is of a prescribed value;
a third latch circuit having a set terminal that receives the signal for set output from the third logic circuit and having a reset terminal that receives the signal for reset output from the second logic circuit; and
the pre-reset circuit including a first pre-reset element that sets the node to a prescribed voltage in response to the signal for reset; and
a second pre-reset element setting the node to a prescribed voltage when the third latch circuit is in a reset state.

9. The DLL circuit according to claim 7, wherein the one-shot pulse generating circuit includes:
a fourth logic circuit having a first input connected to an input end of the one-shot pulse generating circuit;
a delay circuit;
a signal from the input end of the one-shot pulse generating circuit being propagated through the delay circuit and connected to a second input of the fourth logic circuit;
a fifth logic circuit having a first input connected to the input end;
a signal transmitted via the fourth logic circuit being coupled to a second input of the fifth logic circuit;
a sixth logic circuit having a first input connected to the input end, a signal transmitted via the fifth logic circuit being coupled to a second input of the sixth logic circuit,
an output of the sixth logic circuit being connected to an output end of the one-shot pulse generating circuit.

10. The DLL circuit according to claim 8, further comprising:
third and fourth pre-reset elements resetting a connection node of the first delay control circuit and the first transistor and a connection node of the second delay control circuit and the second transistor to the same voltage as that at the node, when an output of the third latch circuit is in a reset state.

11. The DLL circuit according to claim 8, further comprising:
a third transistor connected between the first transistor and the second power supply; and
a fourth transistor connected between the second transistor and the second power supply, wherein
the third and fourth transistors having control terminals supplied with the signal for reset output from the second logic circuit in common to be turned on (conductive) or non-conductive.

12. A DLL (delay locked loop) circuit comprising:
a first variable delay circuit receiving an external signal and a phase adjustment control signal from a phase adjustment circuit and variably setting delay time of the external signal with a prescribed delay time unit based on the phase adjustment control signal,
the first variable delay circuit producing first and second delay signals of a first set of different delay time values in association with a first transition of the external signal,
the first variable delay circuit producing first and second delay signals of a second set of different delay time values in association with a second transition of the external signal;
a pair of second variable delay circuits arranged in association with the first and second delay signals of the first set and with the first and second delay signals of the second set,
the pair of second variable delay circuits receiving the first and second delay signals of the associated sets to output delay signals with delay time set with a resolution finer than the prescribed delay time unit; and
a first synthesis circuit synthesizing delay signals from the pair of second variable delay circuits in association with the first and second transitions of the external signal, wherein
the pair of second variable delay circuits include the first and second one-shot pulse generating circuits, the first and second latch circuits and the synthesis circuit in the DLL circuit according to claim 7.

13. A semiconductor device comprising:
a memory control circuit including a memory cell array and an access circuit therefor, and
a DLL circuit that determines input/output timing of the memory cell array;
the DLL circuit being the DLL circuit according to claim 1.

14. A method for controlling a DLL circuit comprising:
generating first and second delay signals of different delay time values in response to transitions of an external signal;
generating first and second one-shot pulses from the first and second delay signals;
setting first and second latches in association with the first and second one-shot pulses;
discharging or charging a node which has been pre-charged or pre-discharged to a prescribed potential, based on set outputs of the first and second latches, to generate a DLL output signal from the node;

resetting the first and second latches when the voltage at the node reaches a prescribed value;

comparing the external signal and the DLL output signal on transitioning of the external signal and adjusting the time of the first and second delay signals and/or the charging or discharging time of the node based on the result of comparison.

15. The method according to claim 14, further comprising synthesizing a signal at the node associated with rise transition of the external signal and a signal at the node associated with fall transition of the external signal to generate the DLL output signal from the resulting synthesized signal.

16. The method according to claim 14, further comprising resetting the node to the prescribed voltage based on the DLL output signal.

17. The method according to claim 14, further comprising setting a latch based on results of logical operations of the first and second delay signals; and resetting the node to the prescribed voltage based on an output of the latch.

18. The method according to claim 14, further comprising controlling a ratio of a first current value of the charging or discharging associated with an output of the first set and a second current value of the charging or discharging associated with an output of the second set.

19. The method according to claim 14, comprising, in generating the one-shot pulse signal:

generating a first delay signal from the delay signal;

synthesizing the delay signal and the first delay signal logically to generate a first logic signal;

synthesizing the delay signal and the first delay signal logically to generate a second logic signal; and synthesizing the delay signal and the second delay signal logically to generate the one-shot pulse signal.

20. The method according to claim 14, further comprising setting a delay time of each of the first and second delay signals with a prescribed delay time unit;

controlling the DLL output signal by a phase difference between the first and second delay signals; and setting the delay time of the DLL output signal, which is controlled by a phase difference between the first and second delay signals and generated by charging or discharging of the node, with a delay time unit finer in resolution than the prescribed delay time unit.

* * * * *